United States Patent
Lei et al.

(10) Patent No.: US 12,050,397 B2
(45) Date of Patent: Jul. 30, 2024

(54) MASK, EXPOSURE METHOD AND TOUCH PANEL

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Jie Lei, Beijing (CN); Qitao Zheng, Beijing (CN); Zouming Xu, Beijing (CN); Xintao Wu, Beijing (CN); Chunjian Liu, Beijing (CN); Jian Tian, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 286 days.

(21) Appl. No.: 17/421,702

(22) PCT Filed: Mar. 15, 2021

(86) PCT No.: PCT/CN2021/080801
§ 371 (c)(1),
(2) Date: Jul. 8, 2021

(87) PCT Pub. No.: WO2021/238342
PCT Pub. Date: Dec. 2, 2021

(65) Prior Publication Data
US 2022/0342295 A1    Oct. 27, 2022

(30) Foreign Application Priority Data
May 28, 2020    (WO) ................ PCT/CN2020/092806

(51) Int. Cl.
*G06F 3/044*    (2006.01)
*G03F 1/42*    (2012.01)
(Continued)

(52) U.S. Cl.
CPC ............. *G03F 1/42* (2013.01); *G03F 7/0007* (2013.01); *G03F 7/203* (2013.01); *G03F 7/22* (2013.01);
(Continued)

(58) Field of Classification Search
CPC .......... G03F 1/42; G03F 7/0007; G03F 7/203; G03F 7/22; G03F 7/70466; G03F 7/201;
(Continued)

(56) References Cited

U.S. PATENT DOCUMENTS 5,364,718 A    11/1994    Oae et al.
5,922,495 A    7/1999    Kim
(Continued)

FOREIGN PATENT DOCUMENTS

CN    102981356 A    3/2013
CN    104808451 A    7/2015
(Continued)

OTHER PUBLICATIONS

ISA China National Intellectual Property Administration, International Search Report and Written Opinion Issued in Application No. PCT/CN2020/092806, Mar. 4, 2021, WIPO, 16 pages.
(Continued)

*Primary Examiner* — Towfiq Elahi
(74) *Attorney, Agent, or Firm* — McCoy Russell LLP

(57) ABSTRACT

A mask includes a first region and a second region. The first region includes a first light-shielding strip and a second light-shielding strip, the second region includes a third light-shielding strip, the first light-shielding strip, the second light-shielding strip is located between the first light-shield-
(Continued)

ing strip and the third light-shielding strip, the first light-shielding strip, the second light-shielding strip and the third light-shielding strip are configured to shield light and bound spaces, and the spaces are configured in such a manner that light is allowed to pass through the spaces. A width of the first light-shielding strip in a first direction is larger than a width of the second light-shielding strip in the first direction, and the width of the second light-shielding strip in the first direction is larger than a width of the third light-shielding strip in the first direction.

5 Claims, 21 Drawing Sheets

(51) Int. Cl.
  *G03F 7/00* (2006.01)
  *G03F 7/20* (2006.01)
  *G03F 7/22* (2006.01)
(52) U.S. Cl.
  CPC ........ *G03F 7/70466* (2013.01); *G06F 3/0446* (2019.05); *G06F 2203/04112* (2013.01)
(58) Field of Classification Search
  CPC ...... G03F 1/00; G03F 7/70475; G06F 3/0446; G06F 2203/04112; G06F 2203/04103; G06F 3/044
  See application file for complete search history.

(56) References Cited

U.S. PATENT DOCUMENTS

| 2015/0085205 | A1* | 3/2015 | Chen et al. ........... G06F 3/0448 349/12 |
| 2015/0268757 | A1* | 9/2015 | Chandran ............. G06F 3/0446 345/174 |
| 2016/0334674 | A1 | 11/2016 | Yu et al. |
| 2018/0267408 | A1 | 9/2018 | Ortner et al. |
| 2020/0103750 | A1 | 4/2020 | Zheng et al. |
| 2021/0048907 | A1* | 2/2021 | Rhe ....................... G06F 3/0418 |

FOREIGN PATENT DOCUMENTS

| CN | 106200254 A | 12/2016 |
| CN | 107957821 A | 4/2018 |
| CN | 108761995 A | 11/2018 |
| CN | 110515484 A | 11/2019 |
| CN | 111025842 A | 4/2020 |
| CN | 210573180 U | 5/2020 |
| JP | 56318352 A | 1/1988 |
| JP | 105136020 A | 6/1993 |
| JP | 2010113268 A | 5/2010 |

OTHER PUBLICATIONS

ISA China National Intellectual Property Administration, International Search Report and Written Opinion Issued in Application No. PCT/CN2021/080801, Jun. 16, 2021, WIPO, 21 pages.
European Patent Office, Extended European Search Report Issued in Application No. 21733362.4, Feb. 3, 2023, Germany, 15 pages.

* cited by examiner

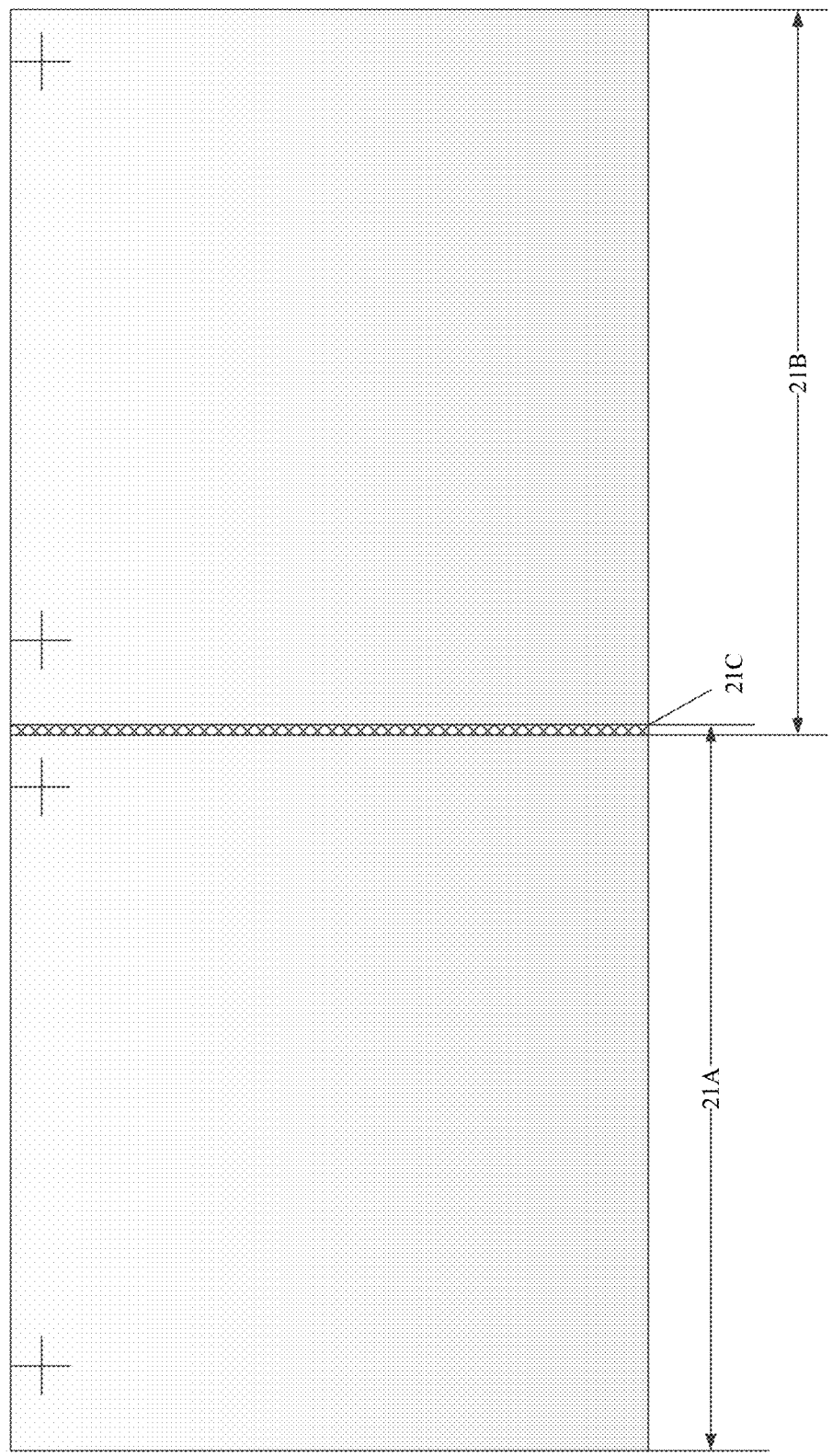

MASK, EXPOSURE METHOD AND TOUCH PANEL

CROSS-REFERENCE TO RELATED APPLICATION

The present application claims a priority of PCT patent application No. PCT/CN2020/092806 filed on May 28, 2020, which is incorporated herein by reference in its entirety.

TECHNICAL FIELD

The present disclosure relates to the field of display technology, and in particular to a mask, an exposure method and a touch panel.

BACKGROUND

Along with a continual development of display technology, a size of a display panel or touch panel continues to increase, and there is a demand to form a large-sized display panel or touch panel by means of a low-generation production line.

SUMMARY

The present disclosure provides a mask, an exposure method and a touch panel.

In an aspect, a mask is provided, including: a first region and a second region, the first region being located on at least one side of the second region. The first region includes a first light-shielding strip and a second light-shielding strip, the second region includes a third light-shielding strip, the first light-shielding strip, the second light-shielding strip and the third light-shielding strip extend in a same direction, the second light-shielding strip is located between the first light-shielding strip and the third light-shielding strip, the first light-shielding strip, the second light-shielding strip and the third light-shielding strip are configured to shield light and bound spaces, and the spaces are configured in such a manner that light is allowed to pass through the spaces. A width of the first light-shielding strip in a first direction is larger than a width of the second light-shielding strip in the first direction, and the width of the second light-shielding strip in the first direction is larger than a width of the third light-shielding strip in the first direction.

Optionally, each second light-shielding strip includes a first light-shielding sub-strip, a second light-shielding sub-strip and a third light-shielding sub-strip, the second light-shielding sub-strip is located between the first light-shielding sub-strip and the third light-shielding sub-strip, a width of the first light-shielding sub-strip in the first direction is larger than a width of the second light-shielding sub-strip in the first direction, and the width of the second light-shielding sub-strip in the first direction is larger than a width of the third light-shielding sub-strip in the first direction.

Optionally, the width of the first light-shielding sub-strip in the first direction gradually decreases along a second direction, and the second direction is substantially perpendicular to the first direction.

Optionally, the first light-shielding sub-strip includes a first edge and a second edge that are opposite to each other in the first direction, an extension line of the first edge intersects an extension line of the second edge, a first angle of the first edge relative to a center line of the first light-shielding sub-strip is larger than 0° and smaller than 90°, and a second angle of the second edge relative to the center line of the first light-shielding sub-strip is larger than 0° and smaller than 90°.

Optionally, the first angle ranges from 45° to 55°, and the second angle ranges from 60° to 70°.

Optionally, a length of the first edge ranges from 1 μm to 10 μm, and a length of the second edge ranges from 1 μm to 10 μm.

Optionally, the second light-shielding sub-strip includes a third edge and a fourth edge that are opposite to each other in the first direction, a length of the third edge in a second direction and a length of the fourth edge in the second direction are not equal to each other, and the second direction is substantially perpendicular to the first direction.

Optionally, the width of the third light-shielding sub-strip in the first direction gradually decreases along a second direction, and the second direction is substantially perpendicular to the first direction.

Optionally, the third light-shielding sub-strip includes a fifth edge and a sixth edge that are opposite to each other in the first direction, an extension line of the fifth edge intersects an extension line of the sixth edge, a third angle of the fifth edge relative to a center line of the third light-shielding sub-strip is larger than 0° and smaller than 90°, and a fourth angle of the sixth edge relative to the center line of the third light-shielding sub-strip is larger than 0° and smaller than 90°.

Optionally, the third angle ranges from 45° to 55°, and the fourth angle ranges from 80° to 90°.

Optionally, a length of the fifth edge ranges from 10 μm to 21 μm, and a length of the sixth edge ranges from 6 μm to 16 μm.

Optionally, widths of all parts of the second light-shielding strip in the first direction are equal to each other along a second direction.

Optionally, center lines of the first light-shielding strip, the third light-shielding strip and the second light-shielding strip coincide with each other.

Optionally, an included angle between a center line of each of the first light-shielding strip, the third light-shielding strip and the second light-shielding strip and an edge of the mask is smaller than 90°.

Optionally, the first light-shielding strip, the third light-shielding strip and the second light-shielding strip are integrally formed.

In another aspect, an exposure method is further provided, including: providing the above-mentioned mask; providing a substrate including a third region and a fourth region; aligning the mask with the third region of the substrate to perform a first exposure; causing the mask to move relative to the substrate; and aligning the mask with the fourth region of the substrate to perform a second exposure.

Optionally, the aligning the mask with the third region of the substrate to perform the first exposure includes: forming a first pattern and a second pattern in the third region by using the first light-shielding strip and the second light-shielding strip of the mask; and forming a third pattern in the third region by using the third light-shielding strip of the mask. A line width of the first pattern is larger than a line width of the second pattern, and the line width of the second pattern is larger than a line width of the third pattern.

Optionally, each second light-shielding strip includes a first light-shielding sub-strip, a second light-shielding sub-strip and a third light-shielding sub-strip, and the substrate further includes a boundary line located between the third region and the fourth region. The aligning the mask with the third region of the substrate to perform the first exposure, includes: forming a second sub-pattern in the third region by using the second light-shielding sub-strip, and forming a third sub-pattern in the third region by using the third light-shielding sub-strip. The aligning the mask with the fourth region of the substrate to perform the second exposure, includes: forming a fourth sub-pattern in the fourth region by using the second light-shielding sub-strip, and forming a fifth sub-pattern in the fourth region by using the third light-shielding sub-strip. The second sub-pattern and the third sub-pattern overlap the fourth sub-pattern and the fifth sub-pattern at an overlapping region, an area of the overlapping region is smaller than a preset threshold, the preset threshold is a product of a first width and a second width, the first width is twice a maximum position deviation of the mask between two exposures in a splicing exposure process, and the second width is a width of the first light-shielding strip in a direction parallel to the boundary line.

Optionally, each second light-shielding strip includes a first light-shielding sub-strip, a second light-shielding strip and a third light-shielding sub-strip, the third light-shielding sub-strip includes a third edge and a fourth edge, an extension line of the third edge intersects an extension line of the fourth edge, the substrate further includes a boundary line between the third region and the fourth region. The aligning the mask with the third region of the substrate to perform the first exposure, includes: forming a second sub-pattern in the third region by using the second light-shielding sub-strip, and forming a third sub-pattern in the third region by using the third light-shielding sub-strip. The third sub-pattern includes a fifth edge and a sixth edge corresponding to the third edge and the fourth edge respectively, the fifth edge is parallel to the boundary line, and a distance between the fifth edge and the boundary line is a maximum position deviation of the mask between two exposures in a splicing exposure process.

Optionally, the aligning the mask with the fourth region of the substrate to perform the second exposure, includes: forming a fourth sub-pattern in the fourth region by using the second light-shielding sub-strip, and forming a fifth sub-pattern in the fourth region by using the third light-shielding sub-strip. The fifth sub-pattern includes a seventh edge and a eighth edge corresponding to the third edge and the fourth edge respectively, the seventh edge is parallel to the boundary line, and a distance between the seventh edge and the boundary line is the maximum position deviation. Center lines of the second sub-pattern, the third sub-pattern, the fourth sub-pattern and the fifth sub-pattern coincide with each other, and the second sub-pattern and the third sub-pattern overlap the fourth sub-pattern and the fifth sub-pattern at an overlapping region.

Optionally, the aligning the mask with the fourth region of the substrate to perform the second exposure, includes: forming a sixth sub-pattern in the fourth region by using the second light-shielding sub-strip; and forming a seventh sub-pattern in the fourth region by using the third light-shielding sub-strip. The seventh sub-pattern includes a ninth edge and a tenth edge corresponding to the third edge and the fourth edge respectively, the ninth edge is parallel to the boundary line, and a distance between the ninth edge and the boundary line ranges from zero to twice the maximum position deviation. The second sub-pattern and the third sub-pattern overlap the sixth sub-pattern and the seventh sub-pattern at an overlapping region.

Optionally, the aligning the mask with the fourth region of the substrate to perform the second exposure, includes: forming an eighth sub-pattern in the fourth region by using the second light-shielding sub-strip; and forming a ninth sub-pattern in the fourth region by using the third light-shielding sub-strip. The second sub-pattern and the third sub-pattern overlap the eighth sub-pattern and the ninth sub-pattern at an overlapping region, center lines of the second sub-pattern and the third sub-pattern coincide with each other, center lines of the eighth sub-pattern and the ninth sub-pattern coincide with each other, and a distance between the center line of the second sub-pattern and the center line of the eighth sub-pattern ranges from zero to the maximum position deviation.

Optionally, the aligning the mask with the fourth region of the substrate to perform the second exposure, includes: forming a tenth sub-pattern in the fourth region by using the third light-shielding sub-strip, where the tenth sub-pattern includes an eleventh edge and a twelfth edge corresponding to the third edge and the fourth edge respectively, the eleventh edge is parallel to the boundary line, and a distance between the eleventh edge and the boundary line is zero; and forming a fourth pattern in the fourth region by using the third light-shielding sub-strip. Center lines of the third sub-pattern, the tenth sub-pattern and the fourth pattern coincide with each other, and the third sub-pattern overlaps the tenth sub-pattern and the fourth pattern at an overlapping region.

Optionally, an area of the overlapping region is smaller than a preset threshold, the preset threshold is a product of a first width and a second width, the first width is twice the maximum position deviation, and the second width is a width of the first light-shielding strip in a direction parallel to the boundary line.

In another aspect, a touch panel is further provided, including: a substrate; a touch driving electrode disposed on the substrate; and a touch sensing electrode disposed on the substrate. At least one of the touch driving electrode and the touch sensing electrode has a metal mesh-like structure including nodes, each node includes a first protruding structure and a second protruding structure distributed on both sides of a center line of a mesh bar, and the first protruding structure and the second protruding structure are arranged in a staggered manner along a direction of the center line.

Optionally, the first protruding structure and the second protruding structure each includes an arc-shaped edge.

Optionally, the substrate includes a third region, a fourth region and a boundary line between the third region and the fourth region, and the nodes are sequentially arranged along the boundary line.

Optionally, the mesh-like structure includes a fifth region located on at least one side of the third region and the fourth region away from the boundary line, the third region includes a first mesh bar, the fourth region includes a second mesh bar, the fifth region includes a third mesh bar, a width of the third mesh bar in a direction perpendicular to an extending direction of the third mesh bar is larger than a width of the first mesh bar in a direction perpendicular to an extending direction of the first mesh bar, and/or, the width of the third mesh bar in the direction perpendicular to the extending direction of the third mesh bar is larger than a width of the second mesh bar in a direction perpendicular to an extending direction of the second mesh bar.

Optionally, the mesh-like structure includes a fourth mesh bar connected to at least one end of the node, a distance between a vertex of the node and a center line of the fourth mesh bar is d3, a width of the fourth mesh bar is d4, a ratio of d3 to d4 is n=d3/d4, and n is larger than or equal to 1 and smaller than or equal to 2.3.

Optionally, lengths of two side edges of the first protruding structure intersecting the center line of the mesh bar are not equal, and/or lengths of two side edges of the second protruding structure intersecting the center line of the mesh bar are not equal.

Optionally, a length of a first side edge of the two side edges of the first protruding structure away from the second protruding structure is smaller than a length of a second side edge close to the second protruding structure, and/or a length of a third side edge of the two side edges of the second protruding structure away from the first protruding structure is smaller than a length of a fourth side edge close to the first protruding structure.

Optionally, the first protruding structure and the second protruding structure in at least one of the nodes are arranged in a central symmetry manner.

Optionally, two side edges of the first protruding structure include a first side edge away from the second protruding structure and a second side edge close to the second protruding structure, two side edges of the second protruding structure include a third side edge away from the first protruding structure and a fourth side edge close to the first protruding structure, the first side edge is angled at a first included angle β1 relative to the center line of the mesh bar, the second side edge is angled at a second included angle β2 relative to the center line of the mesh bar, the third side edge is angled at a third included angle β3 relative to the center line of the mesh bar, the fourth side edge is angled at a fourth included angle β4 relative to the center line of the mesh bar, the first side edge is angled at a fifth included angle β5 relative to the second side edge, and the third side edge is angled at a sixth included angle β6 relative to the fourth side edge, where β1 is larger than or equal to 110° and smaller than or equal to 150°, β2 is larger than or equal to 125° and smaller than or equal to 165°, β3 is larger than or equal to 110° and smaller than or equal to 150°, β4 is larger than or equal to 125° and smaller than or equal to 165°, β5 is larger than or equal to 80° and smaller than equal to 100°, and β6 is larger than or equal to 80° and smaller than or equal to 100°.

Optionally, the mesh-like structure includes a fifth mesh bar and a sixth mesh bar connected to both ends of the node respectively, a distance between a center line of the fifth mesh bar and a center line of the sixth mesh bar is d5, and d5 is larger than or equal to 0 and smaller than or equal to 6 μm.

Optionally, the touch driving electrode and the touch sensing electrode are laminated one on another in a direction perpendicular to the substrate, the touch driving electrode and the touch sensing electrode each has the mesh-like structure including the nodes, and the nodes in different layers are arranged approximately along a same straight line or the nodes in different layers are arranged approximately along two straight lines.

Optionally, the touch driving electrode and the touch sensing electrode are laminated one on another in a direction perpendicular to the substrate, the touch driving electrode and the touch sensing electrode each has the mesh-like structure including the nodes, and orthographic projections of the nodes in different layers onto the substrate at least partially overlap each other. The embodiments of the present disclosure have the following beneficial effects.

In the above scheme, part of the light-shielding strips of the mask are widened with multiple different sizes, and it is able to compensate the position deviation between two exposures, so as to enable a line width of a conductive line in a splicing exposure region of the substrate to be equal to a line width of a conductive line in a normal exposure region of the substrate in a resultant display panel or touch panel, thereby to alleviate or even eliminate a mura phenomenon. In addition, it is able to form the conductive line with an appropriate size at the splicing position after a splicing exposure process, prevent the occurrence of an open circuit due to a too small width of the conductive line at the splicing position, and prevent the occurrence of a ghost image due to a too large width of the conductive line at the splicing position.

BRIEF DESCRIPTION OF THE DRAWINGS

FIG. 4 is a schematic top view of a substrate of a touch panel according to an embodiment of the present disclosure;

DETAILED DESCRIPTION

In order that objects, technical solutions, and advantages of the present disclosure become more apparent, a detailed description will be made as below in conjunction with the accompanying drawings and specific embodiments.

In order to produce a large-sized display panel or touch panel, for example, a size of a mask also needs to be increased accordingly. At present, an exposure machine imposes a restriction on the size of the mask, and a large-sized mask has disadvantages such as difficulty in manufacturing, high cost, and inconvenience in routine storage and use. Therefore, when the large-sized display panel or touch panel is manufactured, generally a large-sized substrate needs to be divided into a plurality of regions, and the regions are sequentially exposed with a mask, thereby forming the large-sized display panel or touch panel. This process is referred as to a splicing exposure process. For example, taking a G6 production line of the BOE touch panel factory as an example, a mask has an effective exposure region of 1100 mm×752 mm, a large-sized touch panel has overall dimensions that exceed the effective exposure region of the mask. For example, a 65" touch panel has overall dimensions of 1460 mm×831 mm, and a 75" touch panel has overall dimensions of 1687 mm×957 mm. Therefore, only if a plurality of exposures, i.e. the splicing exposure process, needs to be performed, a desired pattern may be formed.

Figure 1:
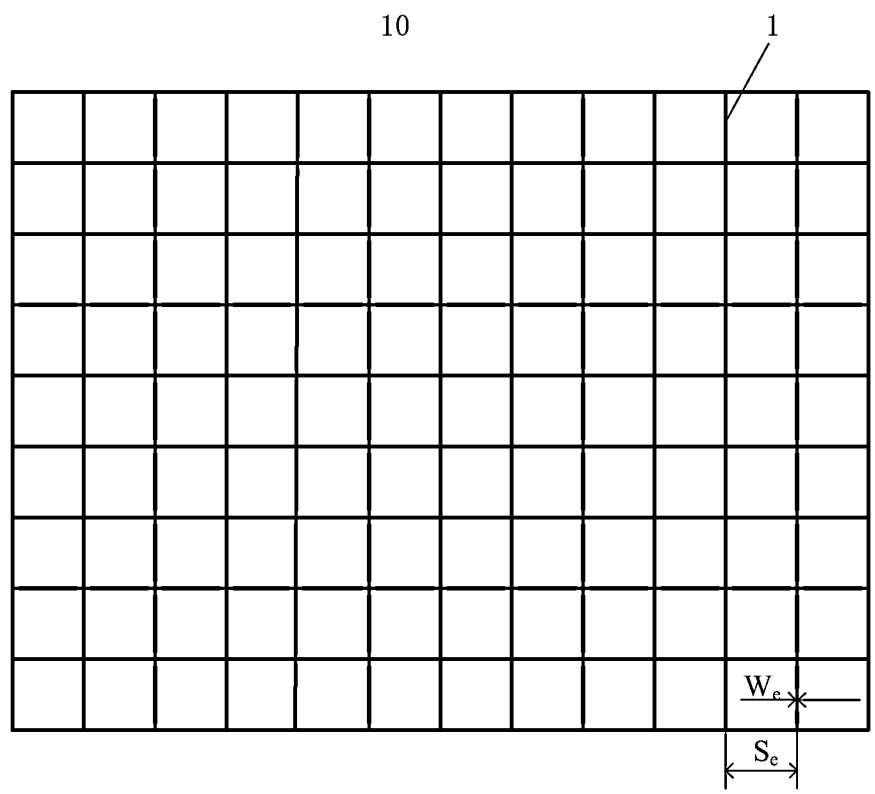
FIG. 1 schematically shows a structure of a metal mesh electrode.

FIG. 1 schematically shows a structure of a metal mesh electrode. With a rapid development of a touch panel industry, a demand for transparent conductors such as indium tin oxide (ITO) has also increased greatly. However, disadvantages of ITO such as high price, low efficiency, fragility and low conductivity, have forced researchers to constantly try to find an electrode material or an electrode structure that may substitute for ITO. A metal mesh electrode is electrode structure that may substitute for ITO. As shown in FIG. 1, the metal mesh 10 includes a plurality of metal lines 1 which are arranged in a mesh shape. Each metal line 1 has a width $W_e$ larger than zero, and there is a space Se between every two adjacent metal lines 1. When the metal mesh electrode is used as a touch electrode of the touch panel, the metal line has a very low resistance, and most of a region of the metal mesh (i.e. a region where the space is located) does not have any light-shielding object so that a light may completely pass through the metal mesh electrode, thereby increasing a transmittance.

Figure 2:
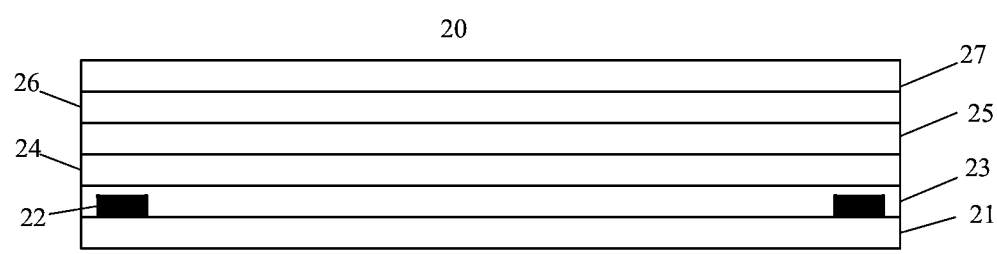
FIG. 2 is a schematic view showing a structure of a touch panel according to an embodiment of the present disclosure.

The metal mesh electrode may be applied in the large-sized touch panel to be used as at least one of a touch driving electrode and a touch sensing electrode. Taking an one-glass solution (OGS) touch panel as an example, as shown in FIG. 2, the touch panel 20 may include: a substrate 21; a black matrix 22 disposed on the substrate 21; a first covering layer (overcoat (OC)) 23 disposed on the substrate 21 and covering the black matrix 22; a touch sensing electrode 24 disposed on the first covering layer 23; a second covering layer 25 disposed on the touch sensing electrode 24; a touch driving electrode 26 disposed on the second covering layer 25; and a third covering layer 27 disposed on the touch driving electrode 26. At least one of the touch sensing electrode 24 and the touch driving electrode 26 may include the metal mesh-like structure shown in FIG. 1.

It should be appreciated that herein the covering layer is a layer for the purpose of insulating or protecting, and is generally a transparent optical material layer.

A patterning process may be used in order to form the touch sensing electrode 24 or the touch driving electrode 26 on the substrate 21. For example, the patterning process may include steps such as an evaporation of a metal, an application of a photoresist, an exposure using a mask, a development, and an etch.

In embodiments of the present disclosure, the substrate 21 may be a large-sized substrate, for example a 65" substrate having overall dimensions of 1460 mm×831 mm or for example a 75" substrate having overall dimensions of 1687 mm×957 mm. The splicing exposure process needs to be performed in an exposure step in order to form the touch sensing electrode 24 or the touch driving electrode 26 on the large-sized substrate 21.

The splicing exposure process will be described in more detail as below by taking a splicing exposure process including two exposures as an example. It should be appreciated by those skilled in the art that the splicing exposure process in the embodiments of the present disclosure is not limited to the splicing exposure process including two exposures, and may include more exposures such as three exposures, four exposures, six exposures, or the like.

Figure 3:
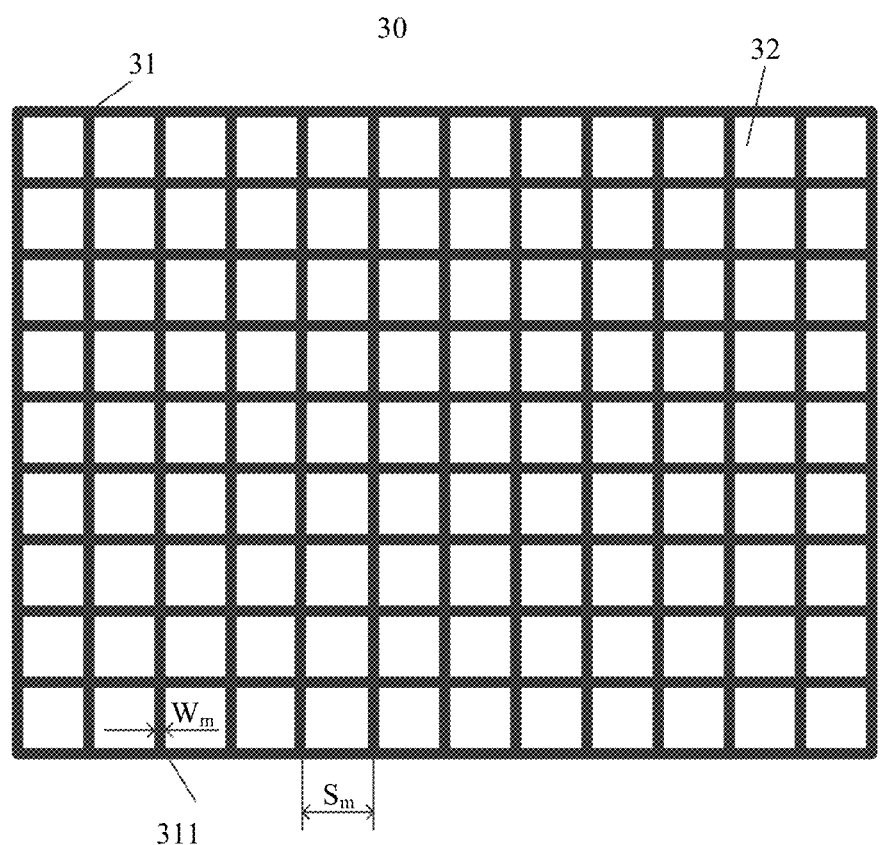
FIG. 3 is a schematic view showing a structure of a mask according to an embodiment of the present disclosure.

In order to form, on the substrate 21, the touch sensing electrode 24 or the touch driving electrode 26 having the metal mesh-like structure shown in FIG. 1, a mask corresponding to the metal mesh-like structure needs to be used in the exposure step. FIG. 3 shows a mask according to an embodiment of the present disclosure. As shown in FIG. 3, the mask 30 includes a light-shielding part 31 and a light transmitting part 32. The light-shielding part 31 includes a plurality of light-shielding strips 311 which are arranged in a mesh shape and each of which has a width Wm. The light transmitting part 32 is formed by the spaces bounded by the plurality of light-shielding strips 311. There is a spacing Sm between every two adjacent light-shielding strips 311. In an example, the light-shielding strip 311 may be made of an opaque material (such as a metal). When an exposure is performed by means of the mask 30, a light may pass through the light transmitting part 32 but is blocked by the light-shielding part 31, so that a pattern corresponding to the mask 30 is formed on the substrate.

The substrate 21 is divided into two regions, i.e. a first region 21A and a second region 21B as shown in FIG. 4. In a first exposure process, an exposure is performed on the first region 21A by means of the mask 30. In a second exposure process, an exposure is performed on the second region 21B by means of the mask 30. A complete pattern of the touch sensing electrode 24 or the touch driving electrode 26 is formed on the substrate 21 by means of the two exposures, thereby satisfying the need to produce the large-sized display panel or touch panel by means of the low-generation production line.

However, in the above exposure processes, a region of the first region 21A adjacent to the second region 21B will be subjected to the two exposure processes, i.e. the first exposure and the second exposure. The region may be referred to as a substrate splicing exposure region, while an exposure region of the substrate 21 except the substrate splicing exposure region may be referred to as a substrate normal exposure region. FIG. 4 schematically shows a substrate splicing exposure region 21C for easy understanding. Theoretically, the metal mesh 10 shown in FIG. 1 may be formed after the splicing exposure, and each metal line 1 has a width $W_e$, and there is a space Se between every two adjacent metal lines 1. However, actually a line width of the metal line 1 formed in the substrate splicing exposure region 21C is smaller than the width $W_e$. As a result, in a display panel or touch panel formed finally, the substrate splicing exposure region has a higher transmittance than the substrate normal exposure region, so that the substrate splicing exposure region has a larger luminance in displaying than the substrate normal exposure region. In other words, a mura phenomenon is generated.

Figure 5A:
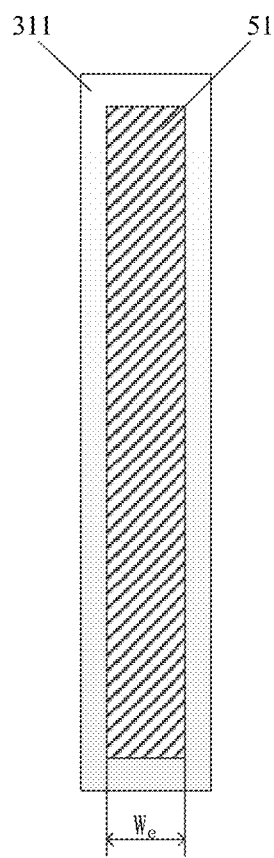
FIGS. 5A to 5C are partially enlarged views schematically showing a substrate splicing exposure region in two exposure processes.
Figure 5B:
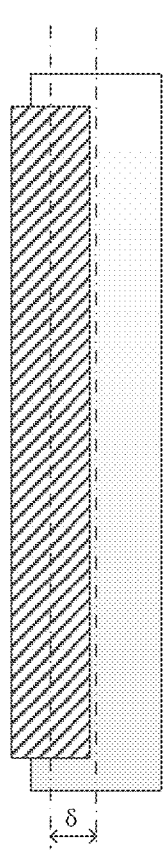
Figure 5C:

It was found by a further analysis that a reason for the generation of the mura phenomenon is an alignment deviation between the two exposure processes. Specifically, FIGS. 5A to 5C are partially enlarged views schematically showing a substrate splicing exposure region in two exposure processes. As shown in FIG. 5A, in a first exposure process, a first metal line 51 having the width $W_e$ is formed in the substrate splicing exposure region due to a light-shielding effect of the light-shielding strip 311 of the mask 30. Then, as shown in FIG. 5B, in a second exposure process, due to a restriction imposed by factors such as a positioning accuracy of an exposure machine, the positional relationship in which the light-shielding strip 311 of the mask 30 and the first metal line 51 are completely aligned with each other as shown in FIG. 5A will not reproduced, but a position deviation δ between the light-shielding strip 311 of the mask 30 and the first metal line 51 will be generated. As a result, in the second exposure process, a portion of the first metal line 51 which is not shielded by the light-shielding strip 311 will be exposed. The first metal line 51 formed finally is as shown in FIG. 5C. Since the portion of the first metal line 51 which is not shielded by the light-shielding strip 311 is exposed in the second exposure process, a line width $W_e'$ of the first metal line 51 formed finally is smaller than the width $W_e$. A difference between the line width $W_e'$ and the width $W_e$ is in direct proportion to the position deviation between the two exposure processes.

Figure 6:
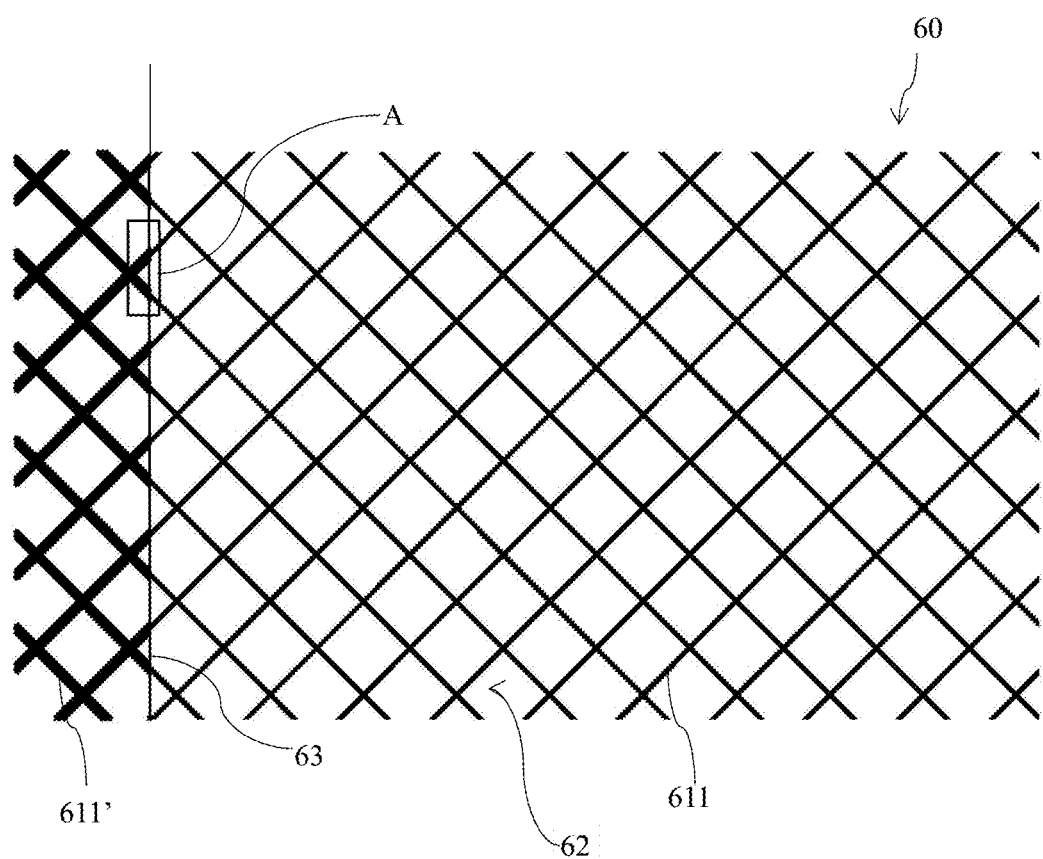
FIG. 6 is another schematic view showing a structure of the mask according to an embodiment of the present disclosure.
Figure 7:
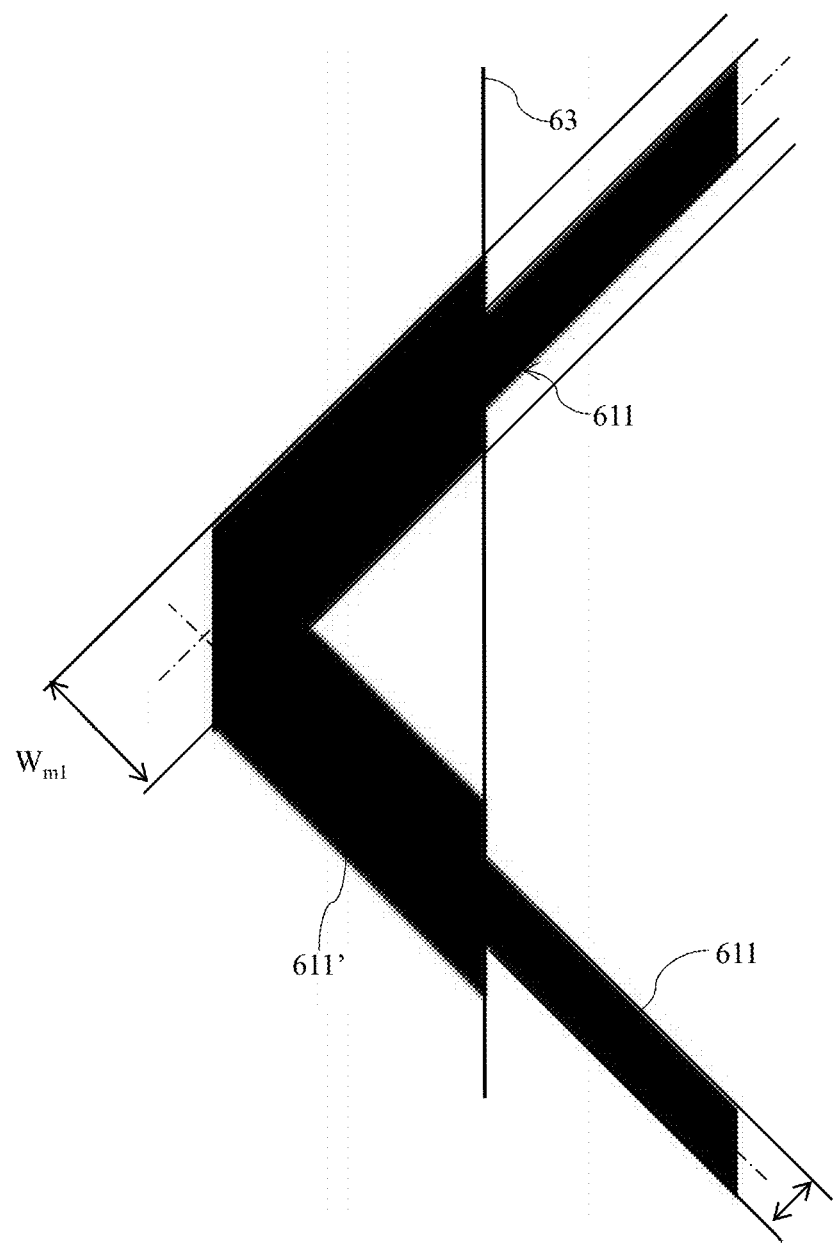
FIG. 7 is a partially enlarged view of part A of the mask shown in FIG. 6.

In order to solve the above technical problems, a mask is provided in the related art. As shown in FIG. 6, the mask 60 includes a light-shielding member 61 and a light transmitting member 62, The light-shielding member is configured to prevent a light from passing through the light-shielding member and the light transmitting member is configured to allow a light to pass through the light transmitting part. The light-shielding member 61 includes a plurality of light-shielding strips which are arranged in a mesh shape, and the light transmitting member 62 is formed by spaces among the plurality of light-shielding strips. The plurality of light-shielding strips may include first light-shielding strips 611' and second light-shielding strips 611. Each of the first light-shielding strips 611' corresponding to the substrate splicing exposure region has a first width $W_{m1}$, as shown in FIG. 7. Each of the second light-shielding strips 611 corresponding to the substrate normal exposure region has a second width $W_{m2}$, as shown in FIG. 7. For example, the first light-shielding strips 611' corresponding to the substrate splicing exposure region may be light-shielding strips located in at least one side edge of the mask 60. In this embodiment, the mask 60 further includes a boundary line 63 between the splicing exposure region of the mask and the normal exposure region of the mask.

In this embodiment, the first width $W_{m1}$ is larger than the second width $W_{m2}$.

Figure 8A:
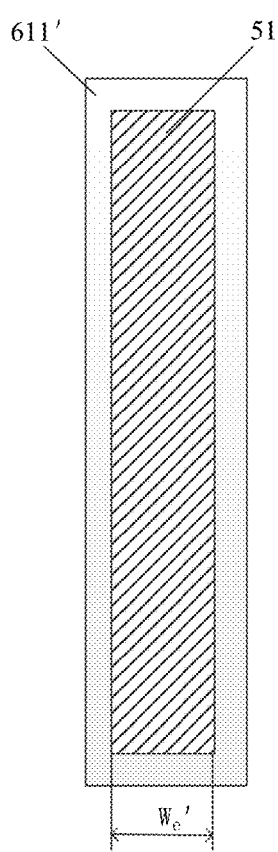
FIGS. 8A to 8C are partially enlarged views schematically showing a substrate splicing exposure region in two exposure processes in a splicing exposure process performed on a substrate using the mask in FIGS. 6-7.
Figure 8B:
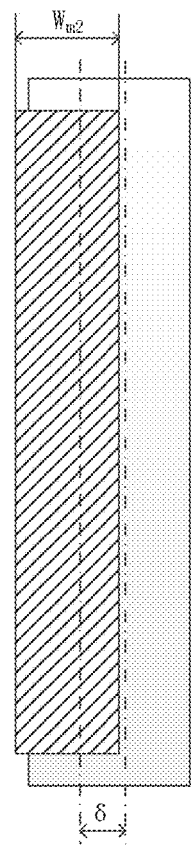
Figure 8C:

FIGS. 8A-8C are partially enlarged views schematically showing a substrate splicing exposure region in two exposure processes; With reference to FIGS. 8A to 8C, in a first exposure process, an exposure is performed on the first region 21A by means of the mask 60. In a second exposure process, an exposure is performed on the second region 21B by means of the mask 60. A complete pattern of the touch sensing electrode 24 or the touch driving electrode 26 is formed on the substrate 21 by means of the two exposures. As shown in FIG. 8A, in the first exposure process, a first metal line 51 having a width $W_e'$ is formed in the substrate splicing exposure region 21C due to a light-shielding effect of the first light-shielding strip 611' of the mask 60. Since the first width $W_{m1}$ of the first light-shielding strip 611' is larger than the width Wm, the width $W_e'$ of the formed first metal line 51 is larger than the width $W_e$. Then, as shown in FIG. 8B, in the second exposure process, due to a restriction imposed by factors such as a positioning accuracy of an exposure machine, a position deviation δ between the first light-shielding strip 611' of the mask 60 and the first metal line 51 will be generated. However, the first light-shielding strip 611' has the first width $W_{m1}$ which is relatively wide, and the first metal line 51 has the width $W_e'$ which is relatively wide. Therefore, in the second exposure process, although there is still a case where the first metal line 51 and the first light-shielding strip 611' partially overlap each other, with a design, an overlap between the first light-shielding strip 611' and the first metal line 51 which are relatively wide may have a width that is equal to a width of the light-shielding strip in the substrate normal exposure region, i.e. the second width $W_{m2}$ of the second light-shielding strip 611. The first metal line 51 formed finally is as shown in FIG. 8C and has a line width equal to the width $W_e$. Therefore, a design in which some of the light-shielding strips of the mask are widened may compensate for the position deviation between the two exposures so that in a display panel or touch panel formed finally, the line width of the metal line in the substrate splicing exposure region is equal to the line width of the metal line in the substrate normal exposure region, thereby alleviating or even eliminating the mura phenomenon.

However, when the mask 60 shown in FIGS. 6 to 7 is used for performing the splicing exposure process, the width of the metal line formed on the substrate splicing exposure region may be relatively large, resulting in low light transmittance in the substrate splicing exposure region, which causes the problem of stripe eliminating of a displayed image.

Figure 9:
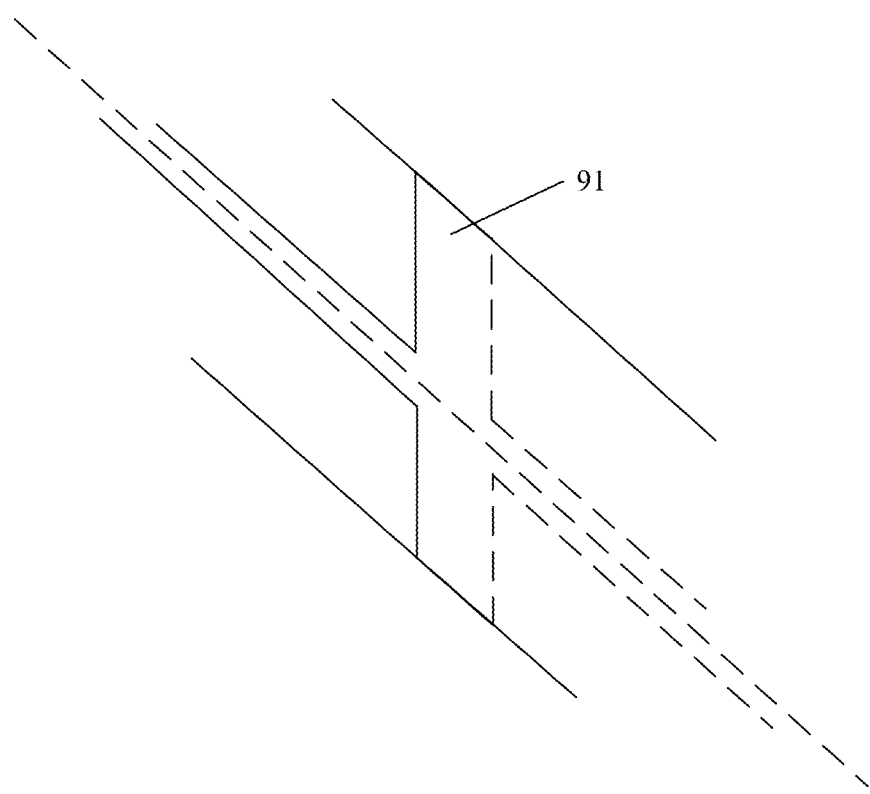
FIG. 9 is a schematic view showing a splicing pattern formed by the substrate splicing exposure region in the splicing exposure process performed on the substrate using the mask in FIGS. 6-7.

FIG. 9 shows a splicing pattern formed by a first pre-pattern formed by exposing a first exposure region of the substrate by using the mask 60 and a second pre-pattern formed by exposing a second exposure region of the substrate by using the mask 60 during the splicing exposure process. However, the width of the splicing pattern may be relatively large, resulting in low light transmittance in the substrate splicing exposure region, which causes the problem of stripe eliminating of a displayed image.

In view of the above technical problem, a mask is provided in some embodiments of the present disclosure.

Figure 10:
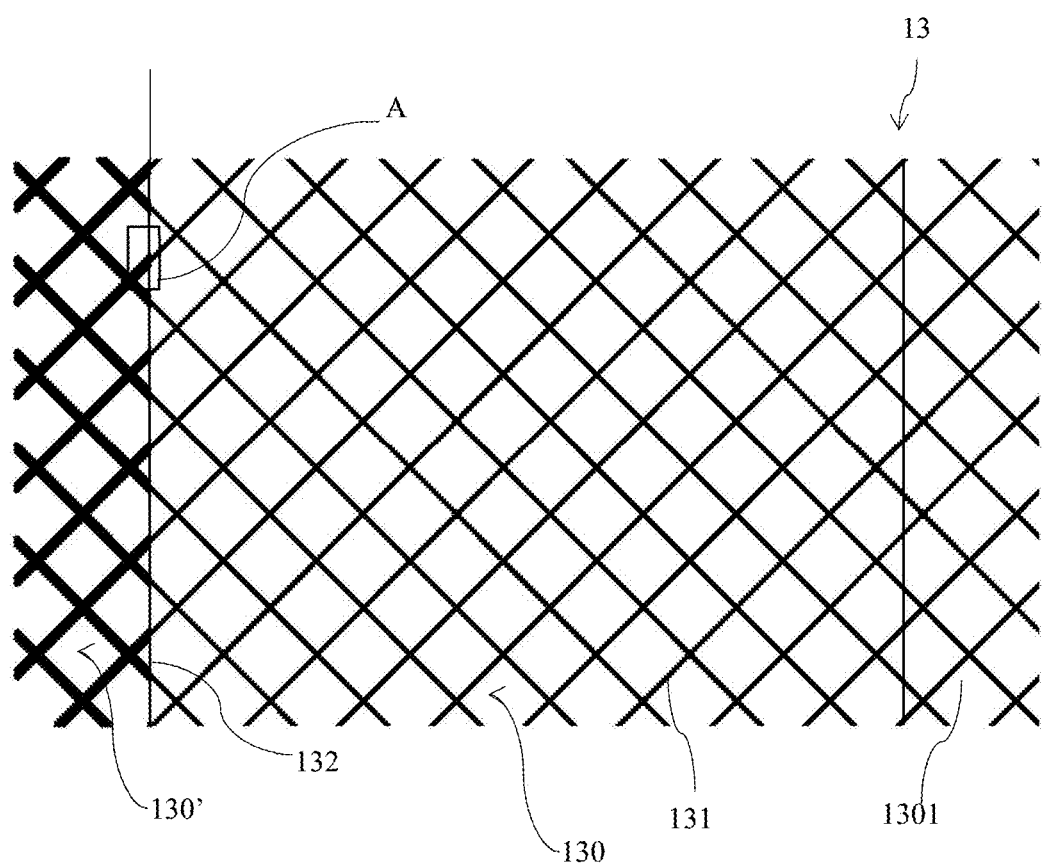
FIG. 10 is yet another schematic view showing a structure of the mask according to an embodiment of the present disclosure.
Figure 11:
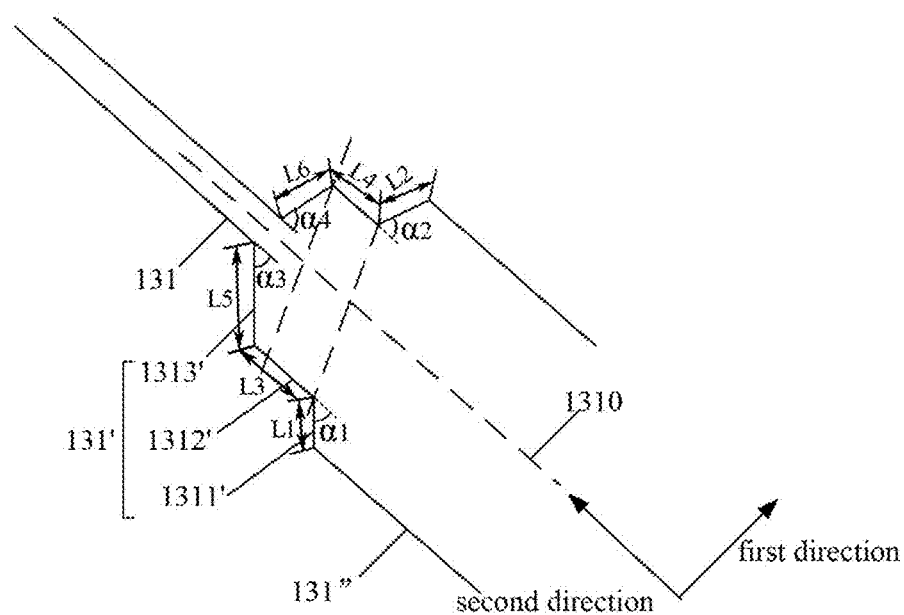
FIG. 11 is a partially enlarged view of part A of the mask shown in FIG. 10 according to an embodiment of the present disclosure.

As shown in FIGS. 10 to 11, a mask 13 includes a first region 130' (i.e., a mask splicing exposure region) and a second region 130 (i.e., a mask normal exposure region), and the first region 130' is located on at least one side of the second region 130. The first region 130' includes a first light-shielding strip 131" and a second light-shielding strip 131', the second region 130 includes a third light-shielding strip 131, the first light-shielding strip 131", the second light-shielding strip 131' and the third light-shielding strip 131 extend in a same direction, the second light-shielding strip 131' is located between the first light-shielding strip 131" and the third light-shielding strip 131. The first light-shielding strip 131", the second light-shielding strip 131' and the third light-shielding strip 131 are configured to block light and bound spaces, and the spaces are configured in such a manner that light is allowed to pass through the spaces. A width of the first light-shielding strip 131" in a first direction is larger than a width of the second light-shielding strip 131' in the first direction, and the width of the second light-shielding strip 131' in the first direction is larger than a width of the third light-shielding strip 131 in the first direction.

In the embodiment of the present disclosure, since the width of the second light-shielding strip 131' in the first direction is smaller than the width of the first light-shielding strip 131" in the first direction, and larger than the width of the third light-shielding strip 131 in the first direction. Thus, it is able to form the conductive line with an appropriate size at the splicing position after a splicing exposure process, prevent the occurrence of an open circuit due to a too small width of the conductive line at the splicing position, and prevent the occurrence of a ghost image due to a too large width of the conductive line at the splicing position, thereby to improve the splicing exposure quality as well as the yield of a display device.

In some embodiments of the present disclosure, as shown in FIG. 11, the second light-shielding strip 131' includes a first light-shielding sub-strip 1311', a second light-shielding sub-strip 1312' and a third light-shielding sub-strip 1313', and the second light-shielding sub-strip 1312' is located between the first light-shielding sub-strip 1311' and the third light-shielding sub-strip 1313', a width of the first light-shielding sub-strip 1311' in the first direction is larger than a width of the second light-shielding sub-strip 1312' in the first direction, and the width of the second light-shielding sub-strip 1312' in the first direction is larger than a width of the third light-shielding sub-strip 1313' in the first direction.

By designing all parts of the second light-shielding strip 131' to have different widths in the first direction, it is possible to better ensure that it is able to form the conductive line with an appropriate size at the splicing position after a splicing exposure process.

In some embodiments of the present disclosure, as shown in FIG. 11, the width of the first light-shielding sub-strip 1311' in the first direction gradually decreases along a second direction, and the second direction is substantially perpendicular to the first direction.

In some embodiments, the second direction is substantially perpendicular to the first direction, optionally, the second direction is perpendicular to the first direction.

As shown in FIG. 11, any width of the first light-shielding sub-strip 1311' in the first direction is larger than the width of the second light-shielding sub-strip 1312' in the first direction.

In some embodiments of the present disclosure, as shown in FIG. 11, the first light-shielding sub-strip 1311' includes a first edge L1 and a second edge L2 that are opposite to each other in the first direction, an extension line of the first edge L1 intersects an extension line of the second edge L2, a first angle $\alpha 1$ of the first edge L1 relative to a center line 1310 of the first light-shielding sub-strip is larger than 0° and smaller than 90°, and a second angle $\alpha 2$ of the second edge relative to the center line 1310 of the first light-shielding sub-strip is larger than 0° and smaller than 90°.

In some embodiments of the present disclosure, the first angle $\alpha 1$ ranges from 45° to 55°, and the second angle $\alpha 2$ ranges from 60° to 70°. The first angle $\alpha 1$ may include end values of 45° and 55°. The second angle $\alpha 2$ may include end values of 60° and 70°. In some embodiments, the first angle $\alpha 1$ may be 50°. In some embodiments, the second angle $\alpha 2$ may be 67°.

In some embodiments, a length of the first edge L1 ranges from 1 μm to 10 μm, and a length of the second edge L2 ranges from 1 μm to 10 μm. In some embodiments, the length of the first edge L1 may be 6.5 μm. The length of the second edge may be 5.5 μm.

In some embodiments of the present disclosure, as shown in FIG. 11, the second light-shielding sub-strip 1312' includes a third edge L3 and a fourth edge L4 that are opposite to each other in the first direction, a length of the third edge L3 in the second direction and a length of the fourth edge L4 in the second direction are not equal to each other, and the second direction is substantially perpendicular to the first direction.

In some embodiments of the present disclosure, as shown in FIG. 11, the width of the third light-shielding sub-strip 1313' in the first direction gradually decreases along a second direction, and the second direction is substantially perpendicular to the first direction.

As shown in FIG. 11, any width of the third light-shielding sub-strip 1313' in the first direction is smaller than the width of the second light-shielding sub-strip 1312' in the first direction.

In some embodiments of the present disclosure, as shown in FIG. 11, the third light-shielding sub-strip 1313' includes a fifth edge L5 and a sixth edge L6 that are opposite to each other in the first direction, an extension line of the fifth edge L5 intersects an extension line of the sixth edge L6, a third angle $\alpha 3$ of the fifth edge L5 relative to a center line 1310 of the third light-shielding sub-strip 1313' is larger than 0° and smaller than 90°, and a fourth angle α4 of the sixth edge L6 relative to the center line 1310 of the third light-shielding sub-strip 1313' is larger than 0°, and smaller than 90°.

In some embodiments of the present disclosure, the third angle α3 ranges from 45° to 55°, and the fourth angle α4 ranges from 80° to 90°. The third angle α3 may include end values of 45° and 55°. The fourth angle α4 may include end values of 80° and 90°. In some embodiments, the third angle α3 may be 50°. In some embodiments, the fourth angle α4 may be 83°.

In some embodiments, a length of the fifth edge ranges from 10 μm to 21 μm, and a length of the sixth edge ranges from 6 μm to 16 μm. In some embodiments, the length of the fifth edge may be 15 μm. In some embodiments, the length of the sixth edge may be 11 μm.

Figure 12:
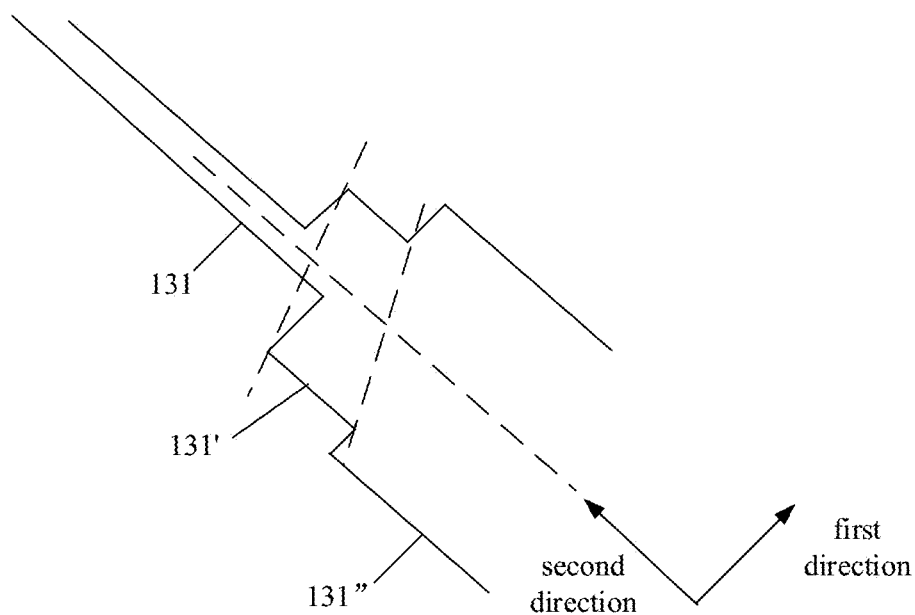
FIG. 12 is another partially enlarged view of part A of the mask shown in FIG. 10 according to an embodiment of the present disclosure.

In some embodiments of the present disclosure, as shown in FIG. 12, widths of all parts of the second light-shielding strip 131' in the first direction are equal to each other along the second direction.

That is, the first edge L1 and the second edge L2 of the first light-shielding strip 1311" and the fifth edge L5 and the sixth edge L6 of the third light-shielding strip 1313' are all perpendicular to the center line, and an angle between each of them and the center line is 90°.

In some embodiments of the present disclosure, as shown in FIGS. 11 and 12, center lines of the first light-shielding strip 131", the second light-shielding strip 131' and the third light-shielding strip 131 coincide with each other.

In some embodiments of the present disclosure, as shown in FIG. 10, an included angle between the center line of each of the first light-shielding strip, the third light-shielding strip and the second light-shielding strip and a side of the mask is smaller than 90°.

In some embodiments of the present disclosure, the first light-shielding strip, the third light-shielding strip and the second light-shielding strip are integrally formed.

In the embodiment shown in FIG. 10, the first light-shielding strips 131" and the second light-shielding strip 131' corresponding to the mask splicing exposure region 130' are light-shielding strips located in a left side edge of the mask 13. In the embodiment shown in FIG. 13, the first light-shielding strips 131" and the second light-shielding strip 131' corresponding to the mask splicing exposure region 130' are light-shielding strips located at left and right side edges of the mask 13. In the embodiment shown in FIG. 14, the first light-shielding strips 131" and the second light-shielding strip 131' corresponding to the mask splicing exposure region 130' are light-shielding strips located at left and right side edges of the mask 13, and light-shielding strips located at upper and lower side edges of the mask 13. In the embodiment shown in FIG. 15, the first light-shielding strips 131" and the second light-shielding strip 131' corresponding to the mask splicing exposure region 130' are light-shielding strips located in two adjacent side edges (the upper side edge and the left side edge) of the mask 13. In the embodiment, the first light-shielding strip 131" and the second light-shielding strip 131' may be located at at least one side edge of the mask 13, except for the first light-shielding strip 131" and the second light-shielding strip 131', the other light-shielding strips 131 are all the third light-shielding strips 131. For example, in the embodiment shown in FIG. 13, the third light-shielding strips 131 may be located at non-side edge of the mask 13. With reference to FIG. 10, FIG. 13, FIG. 14, and FIG. 15, the mask 13 includes four side edges. Except for the four side edges, other positions of the mask 13 may be referred to as non-side edge positions of the mask 13.

According to the embodiment of the present disclosure, the mask splicing exposure region 130' may be provided in the mask 13 according to the needs of the exposure process, and is not limited to the embodiment shown in the figures. In addition, the side edges of the mask 13 may form a rectangular shape, the mask splicing exposure region 130' may have a rectangular shape, the mask 13 may have a rectangular shape, and the mask normal exposure region 130 may have a rectangular shape.

Figure 29:
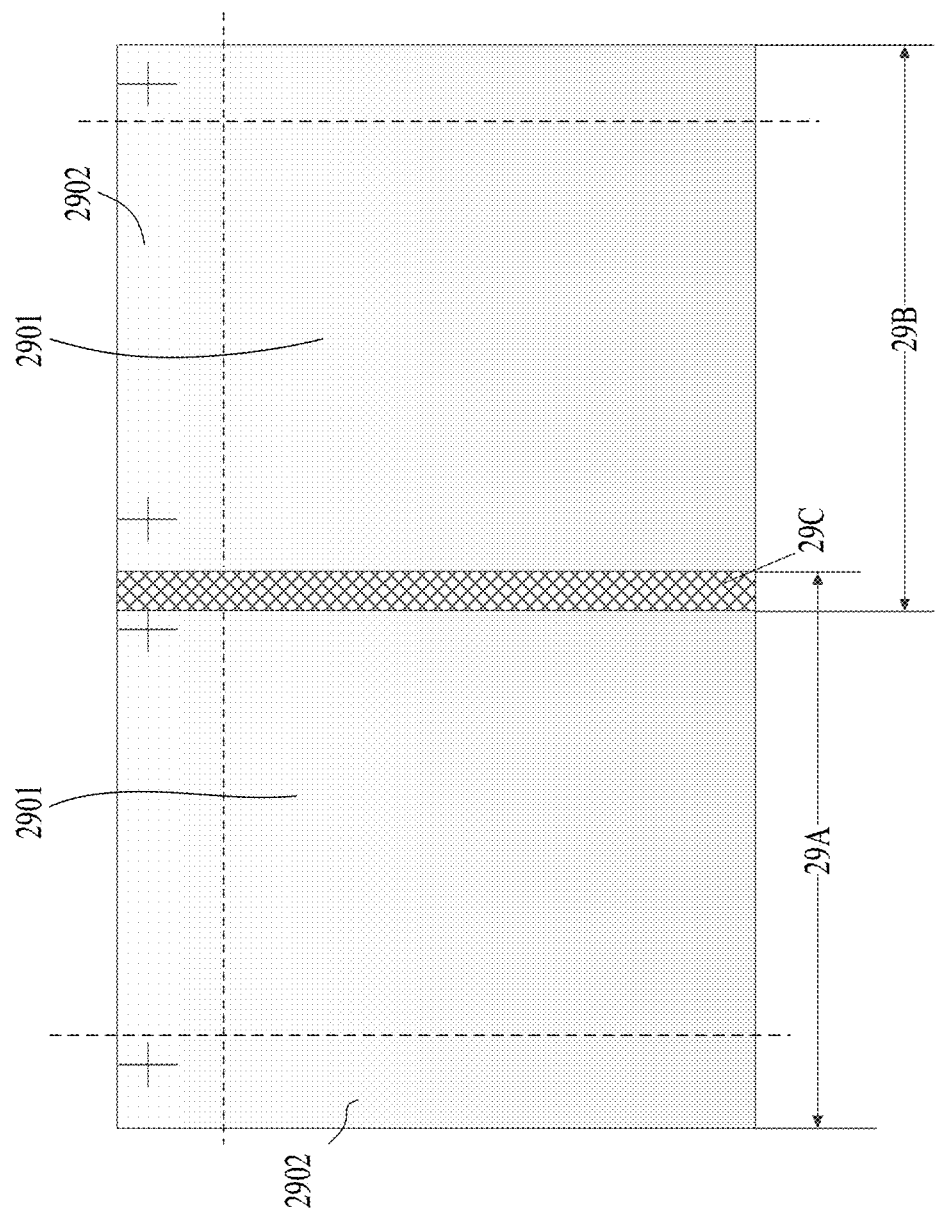
FIG. 29 is another schematic top view of the substrate of the touch panel according to an embodiment of the present disclosure.

An exposure method is further provided in some embodiments of the present disclosure. The exposure method includes: Step 1610, providing the mask according to any of the above embodiments; Step 1620, providing a substrate including a third region and a fourth region; Step 1630, aligning the mask with the third region of the substrate to perform a first exposure; Step 1640, causing the mask to move relative to the substrate; and Step 1650, aligning the mask with the fourth region of the substrate to perform a second exposure. For example, third and fourth regions are denoted as 29A and 29B in FIG. 29, respectively.

In some embodiments of the present disclosure, the aligning the mask with the third region of the substrate to perform the first exposure, includes: forming a first pattern and a second pattern in the third region by using the first light-shielding strip and the second light-shielding strip of the mask; and forming a third pattern in the third region by using the third light-shielding strip of the mask. A line width of the first pattern is larger than a line width of the second pattern, and the line width of the second pattern is larger than a line width of the third pattern.

A size relationship among the first pattern, the second pattern and the third pattern formed in the first exposure may refer to a size relationship among the first light-shielding strip, the second light-shielding strip and the third light-shielding strip shown in FIG. 11.

In some embodiments of the present disclosure, each second light-shielding strip includes a first light-shielding sub-strip, a second light-shielding sub-strip and a third light-shielding sub-strip, and the substrate further includes a boundary line located between the third region and the fourth region. The aligning the mask with the third region of the substrate to perform the first exposure, includes: forming a second sub-pattern in the third region by using the second light-shielding sub-strip, and forming a third sub-pattern in the third region by using the third light-shielding sub-strip. The aligning the mask with the fourth region of the substrate to perform the second exposure, includes: forming a fourth sub-pattern in the fourth region by using the second light-shielding sub-strip, and forming a fifth sub-pattern in the fourth region by using the third light-shielding sub-strip. The second sub-pattern and the third sub-pattern overlap the fourth sub-pattern and the fifth sub-pattern at an overlapping region, an area of the overlapping region is smaller than a preset threshold, the preset threshold is a product of a first width and a second width, the first width is twice a maximum position deviation of the mask between two exposures in a splicing exposure process, and the second width is a width of the first light-shielding strip in a direction parallel to the boundary line.

Figure 21:
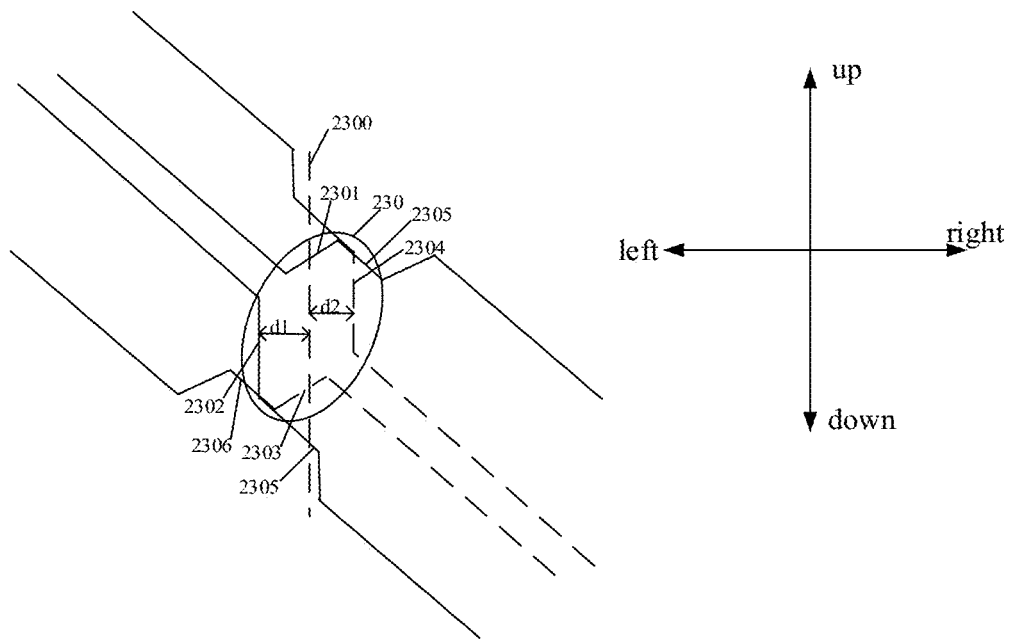
FIG. 21 is a schematic view showing a splicing pattern formed by a substrate splicing exposure region in a splicing exposure process performed on a substrate using the mask in FIG. 13 according to an embodiment of the present disclosure.

In some embodiments, the boundary line may be parallel to an up-down direction as shown in FIG. 21.

Since the width of the second light-shielding strip in the first direction is smaller than the width of the first light-shielding strip in the first direction, in the embodiment of the present disclosure, an area of an overlapping region formed by a part of a pattern on the substrate corresponding to the second light-shielding strip in the mask during the first exposure and a part of a pattern on the substrate corresponding to the second light-shielding strip in the mask during the second exposure is smaller than the preset threshold. The preset threshold may be an area of an overlapping region formed by a pattern on the substrate corresponding to the second light-shielding strip in the mask during the first exposure and a pattern on the substrate corresponding to the second light-shielding strip in the mask during the second exposure in the related art, as shown by 91 in FIG. 9.

Figure 13:
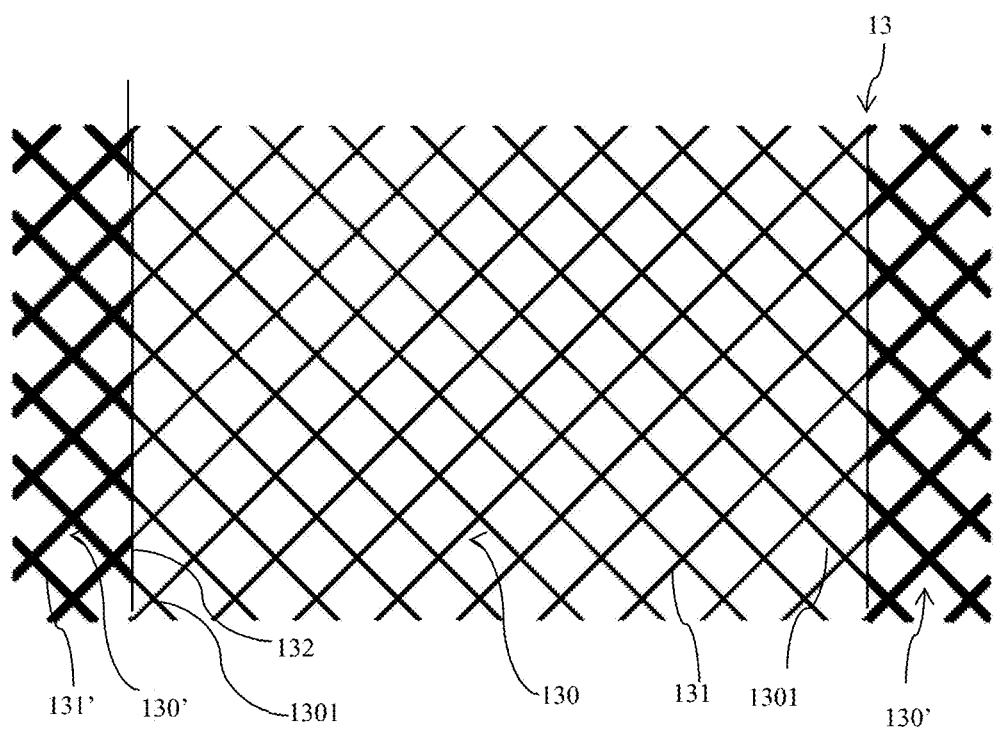
FIG. 13 is still yet another schematic view showing a structure of the mask according to an embodiment of the present disclosure.
Figure 17:
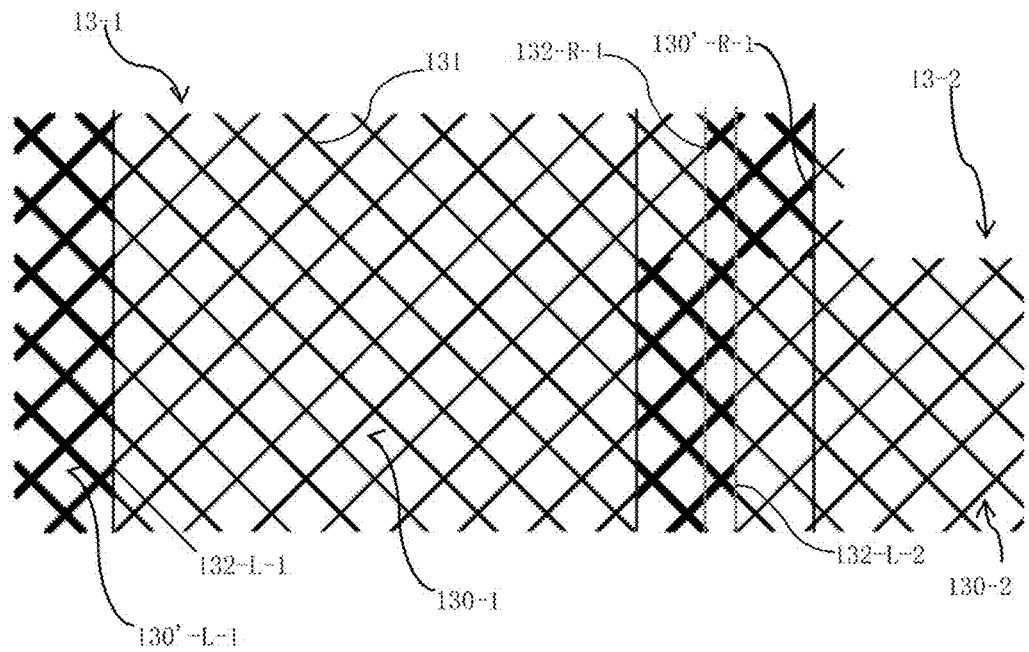
FIG. 17 is a partially top view schematically showing a relation between positions of the mask in two successive exposures when the splicing exposure process is performed by means of the mask shown in FIG. 13.
Figure 18:
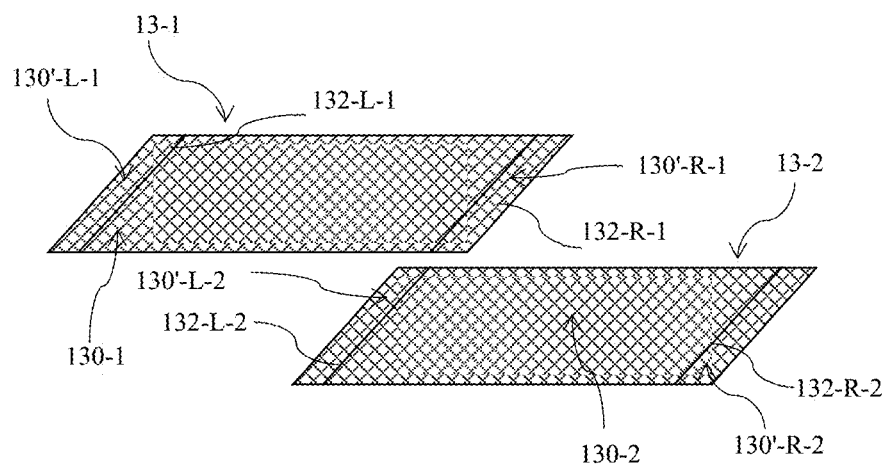
FIG. 18 is a perspective view schematically showing the relation between positions of the mask in two successive exposures when the splicing exposure process is performed by means of the mask shown in FIG. 13.
Figure 19:
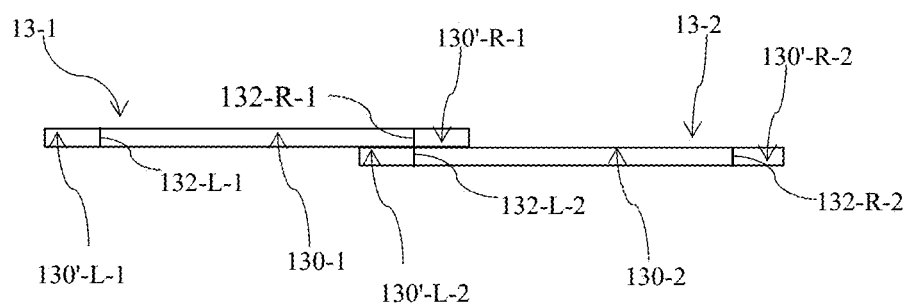
FIG. 19 is a front view schematically showing the relation between positions of the mask in two successive exposures when the splicing exposure process is performed by means of the mask shown in FIG. 13.
Figure 20:
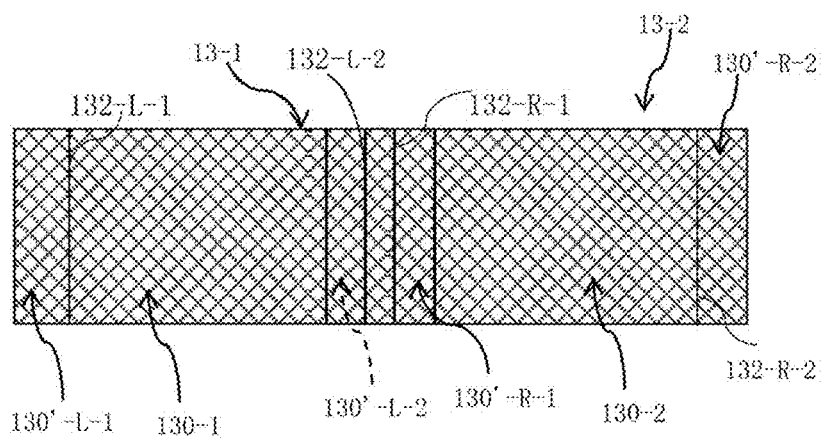
FIG. 20 is a top view schematically showing the relation between positions of the mask in two successive exposures when the splicing exposure process is performed by means of the mask shown in FIG. 13.

FIG. 17 is a partially top view schematically showing a relation between positions of the mask in two successive exposures when the splicing exposure process is performed by means of the mask shown in FIG. 13. FIG. 18 is a perspective view schematically showing the relation between positions of the mask in two successive exposures when the splicing exposure process is performed by means of the mask shown in FIG. 13. FIG. 19 is a front view schematically showing the relation between positions of the mask in two successive exposures when the splicing exposure process is performed by means of the mask shown in FIG. 13. FIG. 20 is a top view schematically showing the relation between positions of the mask in two successive exposures when the splicing exposure process is performed by means of the mask shown in FIG. 13;

In FIGS. 17 to 20, for the sake of clarity, "–L" is added to the reference numeral of a left mask splicing exposure region (a first mask splicing exposure region), and "–R" is added to the reference numeral of a right mask splicing exposure region (a second mask splicing exposure region), and "–L" is added to the reference numeral of a left boundary line (a first boundary line), "–R" is added to the reference numeral of a right boundary line (a second boundary line). In addition, "–1" is added to the reference numerals of the mask 13 and the components of the mask 13 in the first exposure, and "–2" is added to the reference numerals of the mask 13 and the components of the mask 13 in the second exposure. It should be appreciated that the mask in FIGS. 17 to 20 is only to illustrate the relative positional relationship of the projections formed by the mask using an exposure light source in two consecutive exposures, rather than an actual positional relationship of the mask. Therefore, the mask in FIGS. 17 to 20 may be understood to a certain extent as a projection formed by the mask using the exposure light source.

In FIGS. 17 to 20, a left mask 13-1 represents the mask positioned in the first exposure in the two successive exposures, and a right mask 13-2 represents the mask positioned in the second exposure in the two successive exposures. FIG. 17 only shows a part of the mask 13-2 during the second exposure.

With reference to FIGS. 17 to 20, according to the embodiments of the present disclosure, during a first exposure process, an exposure is performed on the first region of the substrate by means of the mask 13-1. In a second exposure process, an exposure is performed on the second region of the substrate by means of the mask 13-2. A complete pattern of the touch sensing electrode or the touch driving electrode is formed on the substrate by means of the two exposures. Therefore, part of the light-shielding strips of the mask are widened with multiple different sizes, and it is able to compensate the position deviation between two exposures, so as to enable a line width of a conductive line in a splicing exposure region of the substrate to be equal to a line width of a conductive line in a normal exposure region of the substrate in a resultant display panel or touch panel, thereby to alleviate or even eliminate a mura phenomenon. In addition, it is able to form the conductive line with an appropriate size at the splicing position after a splicing exposure process, prevent the occurrence of an open circuit due to a too small width of the conductive line at the splicing position, and prevent the occurrence of a ghost image due to a too large width of the conductive line at the splicing position.

Referring to FIGS. 10, 17 to 20, in the embodiments of the present disclosure, the mask 13 further includes: the first mask splicing exposure region 130'-L and the second mask splicing exposure region 130'-R, and the mask normal exposure region 130. The first mask splicing exposure region 130'-L and the second mask splicing exposure region 130'-R are respectively formed by two opposite side regions of the mask 13, and the first mask splicing exposure region 130'-L and the second mask splicing exposure region 130'-R each has a rectangular shape. The mask normal exposure region 130 is located between the first mask splicing exposure region 130'-L and the first mask splicing exposure region 130'-R. There is a first boundary line 132-L between the first mask splicing exposure region 130'-L and the mask normal exposure region 130, and there is a second boundary line 132-R between the second mask splicing exposure region 130'-R and the mask normal exposure region 130. The first light-shielding strip 131" and the second light-shielding strip 131' are located in the first mask splicing exposure region 130'-L and the first mask splicing exposure region 130'-R of the mask 13 respectively, and the third light-shielding strip 131 is located in the mask normal exposure region 130.

Referring to FIGS. 17 to 20, in the embodiment of the present disclosure, a projection of the first boundary line 132-L-2 of the mask 13-2 onto the substrate during the second exposure and a projection of the second boundary line 132-R-1 of the mask 13-1 onto the substrate during the first exposure do not overlap. For example, the projection formed by the first boundary line 132-L-2 of the mask 13-2 on the substrate using the exposure light source during the second exposure and the projection formed by the second boundary line 132-R-1 of the mask 13-1 on the substrate using the exposure light source during the first exposure do not overlap each other. For example, when the mask 13 is translated from a position for the first exposure to a position for the second exposure, the first boundary line 132-L-2 of the mask 13-2 during the second exposure and the second boundary line 132-R-1 of the mask 13-1 during the first exposure do not coincide with each other and are spaced apart from each other at a certain distance.

In some embodiments of the present disclosure, each second light-shielding strip includes a first light-shielding sub-strip, a second light-shielding strip and a third light-shielding sub-strip, the third light-shielding sub-strip includes a third edge and a fourth edge, an extension line of the third edge intersects an extension line of the fourth edge, the substrate further includes a boundary line between the third region and the fourth region. The aligning the mask with the third region of the substrate to perform the first exposure, includes: forming a second sub-pattern in the third region by using the second light-shielding sub-strip, and forming a third sub-pattern in the third region by using the third light-shielding sub-strip. The third sub-pattern includes a fifth edge and a sixth edge corresponding to the third edge and the fourth edge respectively, the fifth edge is parallel to the boundary line, and a distance between the fifth edge and the boundary line is a maximum position deviation of the mask between two exposures in a splicing exposure process.

After the first exposure, the mask 13-1 forms the corresponding first pre-pattern on the substrate during the first exposure, and the first pre-pattern includes the second sub-pattern and the third sub-pattern.

In some embodiments, the fifth edge is parallel to the boundary line. As shown in FIG. 21, the fifth edge 2304 is parallel to the boundary line 2300, and the distance d2 between the fifth edge 2304 and the boundary line 2300 is the maximum position deviation D of the mask between two exposures in the splicing exposure process.

In some embodiments of the present disclosure, the aligning the mask with the fourth region of the substrate to perform the second exposure, includes: forming a fourth sub-pattern in the fourth region by using the second light-shielding sub-strip, and forming a fifth sub-pattern in the fourth region by using the third light-shielding sub-strip. The fifth sub-pattern includes a seventh edge and a eighth edge corresponding to the third edge and the fourth edge respectively, the seventh edge is parallel to the boundary line, and a distance between the seventh edge and the boundary line is the maximum position deviation. Center lines of the second sub-pattern, the third sub-pattern, the fourth sub-pattern and the fifth sub-pattern coincide with each other, and the second sub-pattern and the third sub-pattern overlap the fourth sub-pattern and the fifth sub-pattern at an overlapping region.

After the second exposure, the mask 13-1 forms the corresponding second pre-pattern on the substrate during the second exposure, and the second pre-pattern includes the fourth sub-pattern and the fifth sub-pattern.

In some embodiments, the seventh edge is parallel to the boundary line. As shown in FIG. 21, the seventh edge 2302 is parallel to the boundary line 2300, and the distance d1 between the seventh edge 2302 and the boundary line 2300 is the maximum position deviation D of the mask between two exposures in the splicing exposure process, i.e. d1=d2. In addition, the center lines of the fourth sub-pattern and the fifth sub-pattern completely coincide with the center lines of the second sub-pattern and the third sub-pattern.

A part of a projection of the second light-shielding strip 131' in the first mask exposure region 130'-L-2 of the mask 13-2 onto the substrate during the second exposure overlap a part of a projection of the second light-shielding strip 131' in the second mask splicing exposure region 130'-R-1 of the mask 13-1 onto the substrate during the first exposure. As shown in FIG. 21, during the second exposure, the second light-shielding sub-strip 1312' and the third light-shielding sub-strip 1313' of the second light-shielding strip 131' in the first mask exposure region 130'-L-2 of the mask 13-2 respectively form the fourth sub-pattern and the fifth sub-pattern on the substrate. During the first exposure, the second light-shielding sub-strip 1312' and the third light-shielding sub-strip 1313' of the second light-shielding strip 131' of the second mask splicing exposure region 130'-R-1 of the mask 13-1 respectively form the second sub-pattern and the third sub-pattern on the substrate, the second sub-pattern and the third sub-pattern overlap the fourth sub-pattern and the fifth sub-pattern at an overlapping region, and a pattern corresponding to the overlapping region is a first pattern 230. The first pattern 230 has a hexagonal shape. An area of the first pattern 230 is smaller than the preset threshold, the preset threshold is the product of the first width and the second width, the first width is twice the maximum position deviation D, that is, 2D, and the second width is the width of the first light-shielding strip in a direction parallel to the boundary line. In some embodiments, the preset threshold may be an area of a rectangle shown by 91 in FIG. 9.

As shown in FIG. 21, the first pattern 230 is formed by a part of an edge 2305 of the fourth sub-pattern, a seventh edge 2302 and an eighth edge 2301 of the fifth sub-pattern formed on the display substrate by the second light-shielding sub-strip of the mask 13-2 during the second exposure and a part of an edge 2306 of the second sub-pattern, a fifth edge 2304 and a sixth edge 2303 of the third sub-pattern formed on the display substrate by the second light-shielding sub-strip of the mask 13-1 during the first exposure. An extension line of the seventh edge 2302 intersects an extension line of the eighth edge 2301 at a pattern (i.e., a fourth pattern below formed in the fourth region by using the third light-shielding sub-strip) corresponding to the third light-shielding strip of the mask 13-2 during the second exposure, so as to form one angle of the first pattern 230. Similarly, an extension line of the fifth edge 2304 intersects an extension line of the sixth edge 2303 at a pattern corresponding to the third light-shielding strip of the mask 13-1 during the first exposure, so as to form another angle of the first pattern.

FIG. 21 shows a case where the light-shielding strip of the mask during the second exposure is completely aligned with a conductive line of the first pre-pattern formed on the substrate by the mask during the first exposure.

As shown in FIG. 21, a center line of the first pre-pattern completely coincides with a center line of the second pre-pattern, and the distance d1 between the seventh edge 2302 and the boundary line is equal to the distance d2 between the fifth edge 2304 and the boundary line, and equal to the maximum position deviation D of the mask between two exposures in the splicing exposure process. In some embodiments, D may be 6 μm. The maximum position deviation D is referred to as a maximum distance at which each light-shielding strip of the mask in the second exposure may offset in each of upper, lower, left and right directions relative to each conductive line in the first pre-pattern shown in FIG. 21 in actual situations. The second sub-pattern and the third sub-pattern may each be a part of the conductive line.

However, in the actual situations, due to factors such as the positioning accuracy of the exposure machine, the light-shielding strip of the mask may be not completely aligned with the conductive line of the first pre-pattern during the second exposure. Taking a position of the mask during the second exposure corresponding to FIG. 21 as a reference, a position of the light-shielding strip of the mask during the second exposure in the actual situation may be shifted in upper, lower, left and right directions relative to the position of the light-shielding strip of the mask during the second exposure in FIG. 21, and FIG. 21 shows the upper, lower, left and right directions.

In the actual situation, the position of the mask during the second exposure is shifted in the left and right directions relative to the position of the mask during the second exposure corresponding to FIG. 21 as follows.

After forming the first pre-pattern through the first exposure, the aligning the mask with the fourth region of the substrate to perform the second exposure, includes: forming a sixth sub-pattern in the fourth region by using the second light-shielding sub-strip, and forming a seventh sub-pattern in the fourth region by using the third light-shielding sub-strip. The seventh sub-pattern includes a ninth edge and a tenth edge corresponding to the third edge and the fourth edge respectively, the ninth edge is parallel to the boundary line, and a distance between the ninth edge and the boundary line ranges from zero to twice the maximum position deviation. The second sub-pattern and the third sub-pattern overlap the sixth sub-pattern and the seventh sub-pattern at an overlapping region.

When the position of the light-shielding strip of the mask during the second exposure is shifted to the left by the maximum position deviation D relative to the position of the mask during the second exposure corresponding to FIG. 21, the distance between the ninth edge and the boundary line is twice the maximum position deviation D. When the position of the mask during the second exposure is shifted to the right by the maximum position deviation D relative to the position of the mask during the second exposure corresponding to FIG. 21, the distance between the ninth edge and the boundary line is zero. In the actual situations, the position of the mask during the second exposure may be shifted relative to the position of the mask during the second exposure corresponding to FIG. 21 by any value from zero to the maximum position deviation D in the left and right directions, second sub-pattern and the third sub-pattern still overlap the sixth sub-pattern and the seventh sub-pattern at the overlapping region overlapping region, and a size of a pattern corresponding to the overlapping region is appropriate, so as to prevent the occurrence of an open circuit due to a too small size of the pattern, and prevent the occurrence of a ghost image due to a too large size of the pattern.

In the actual situations, the position of the mask during the second exposure is shifted upwards and downwards relative to the position of the mask during the second exposure corresponding to FIG. 21 as follows.

After forming the first pre-pattern through the first exposure, the aligning the mask with the fourth region of the substrate to perform the second exposure, includes: forming an eighth sub-pattern in the fourth region by using the second light-shielding sub-strip, and forming a ninth sub-pattern in the fourth region by using the third light-shielding sub-strip. The second sub-pattern and the third sub-pattern overlap the eighth sub-pattern and the ninth sub-pattern at an overlapping region, center lines of the second sub-pattern and the third sub-pattern coincide with each other, center lines of the eighth sub-pattern and the ninth sub-pattern coincide with each other, and a distance between the center line of the second sub-pattern and the center line of the eighth sub-pattern ranges from zero to the maximum position deviation.

When the position of the mask during the second exposure is shifted upwards by the maximum position deviation D relative to the position of the mask during the second exposure corresponding to FIG. 21, the distance between the center line of the eighth sub-pattern and the center line of the second sub-pattern is the maximum position deviation D. When the position of the mask during the second exposure is shifted upwards by the maximum position deviation D relative to the position of the mask during the second exposure corresponding to FIG. 21, the distance between the center line of the second sub-pattern and the center lines of the eighth sub-pattern is the maximum position deviation D. In the actual situations, the position of the mask during the second exposure may be shifted relative to the position of the mask during the second exposure corresponding to FIG. 21 by any value from zero to the maximum position deviation D in the up and down directions, the second sub-pattern and the third sub-pattern still overlap the eighth sub-pattern and the ninth sub-pattern at the overlapping region, and a size of a pattern corresponding to the overlapping region is appropriate, so as to prevent the occurrence of an open circuit due to a too small size of the pattern, and prevent the occurrence of a ghost image due to a too large size of the pattern.

Figure 22:
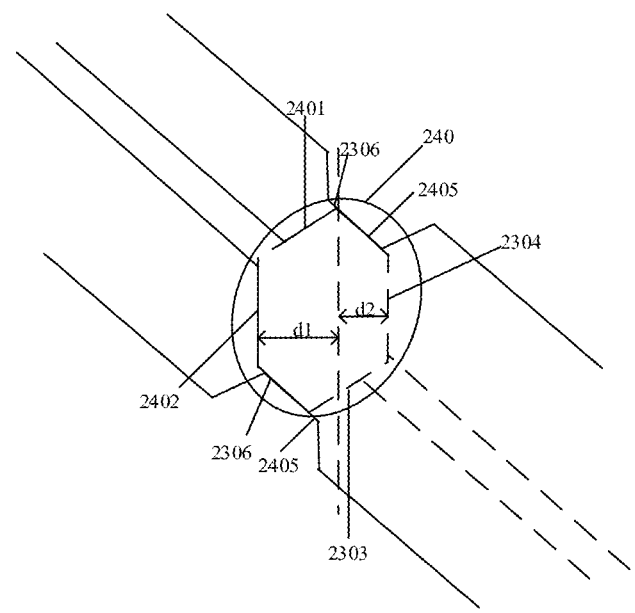
FIG. 22 is another schematic view showing the splicing pattern formed by the substrate splicing exposure region in the splicing exposure process performed on the substrate using the mask in FIG. 13 according to an embodiment of the present disclosure.
Figure 23:
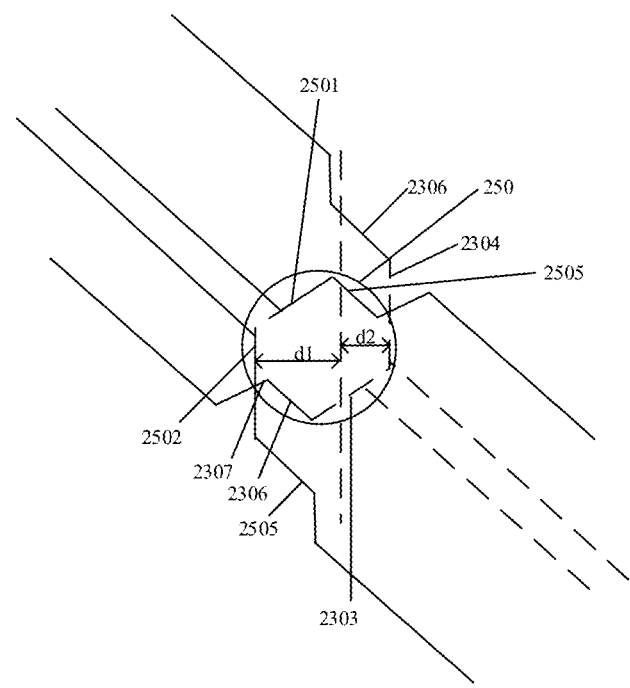
FIG. 23 is yet another schematic view showing the splicing pattern formed by the substrate splicing exposure region in the splicing exposure process performed on the substrate using the mask in FIG. 13 according to an embodiment of the present disclosure.
Figure 24:
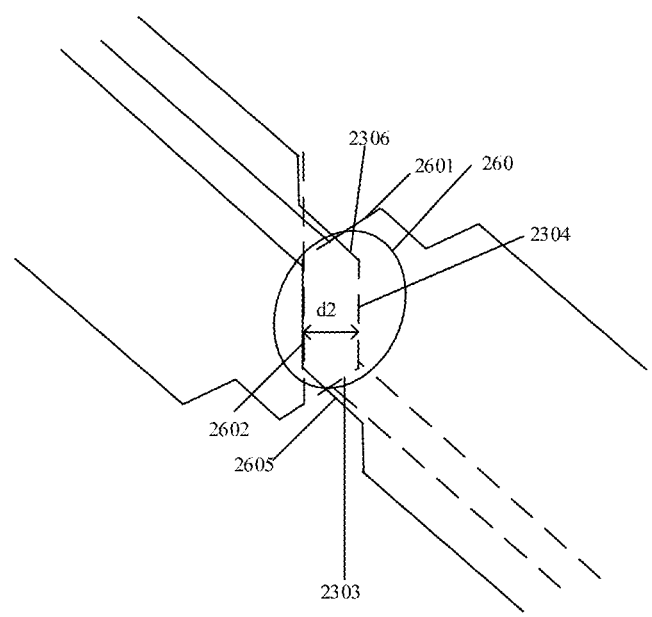
FIG. 24 is still yet another schematic view showing the splicing pattern formed by the substrate splicing exposure region in the splicing exposure process performed on the substrate using the mask in FIG. 13 according to an embodiment of the present disclosure.
Figure 25:
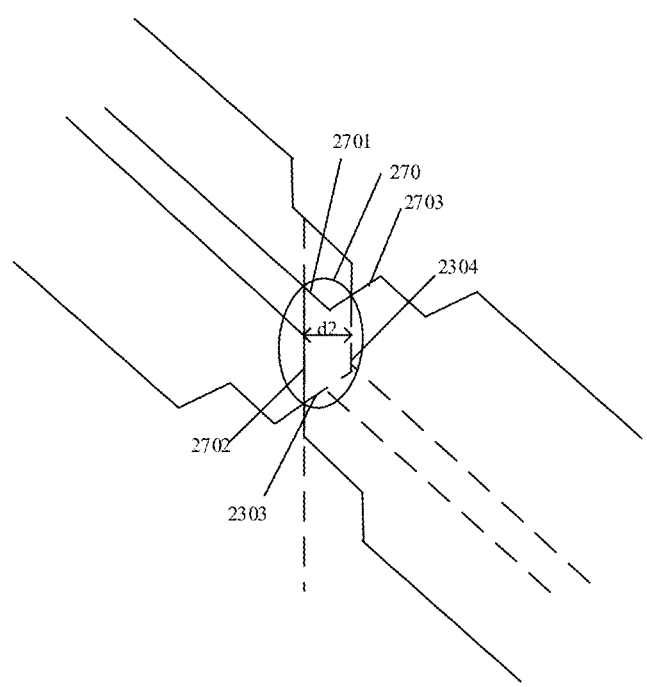
FIG. 25 is still yet another schematic view showing the splicing pattern formed by the substrate splicing exposure region in the splicing exposure process performed on the substrate using the mask in FIG. 13 according to an embodiment of the present disclosure.

FIGS. 22 to 25 exemplarily show several examples that there are alignment offsets between the light-shielding strip of the mask during the second exposure and the conductive line of the first pre-pattern formed on the substrate by the mask during the first exposure. Taking the position of the second pre-pattern shown in FIG. 21 as a reference, the second pre-pattern formed after the second exposure in FIG. 22 is shifted to the left and upwards each by the maximum position deviation D relative to the second pre-pattern in FIG. 21, the second pre-pattern formed after the second exposure in FIG. 23 is shifted to the left and downwards each by the maximum position deviation D relative to the second pre-pattern in FIG. 21, the second pre-pattern formed after the second exposure in FIG. 24 is shifted to the right and upwards each by the maximum position deviation D relative to the second pre-pattern in FIG. 21, and the second pre-pattern formed after the second exposure in FIG. 25 is shifted to the right and downwards each by the maximum position deviation D relative to the second pre-pattern in FIG. 21.

Specifically, the second pre-pattern formed after the second exposure in FIG. 22 is shifted to the left by the maximum position deviation D relative to the second pre-pattern in FIG. 21, and then is shifted upwards by the maximum position deviation D.

A part of a projection of the second light-shielding strip 131' in the first mask exposure region 130'-L-2 of the mask 13-2 onto the substrate during the second exposure overlap a part of a projection of the second light-shielding strip 131' in the second mask splicing exposure region 130'-R-1 of the mask 13-1 onto the substrate during the first exposure. As shown in FIG. 22, during the second exposure, the second light-shielding sub-strip 1312' and the third light-shielding sub-strip 1313' of the second light-shielding strip 131' in the first mask exposure region 130'-L-2 of the mask 13-2 respectively form the eleventh sub-pattern and the twelfth sub-pattern on the substrate. During the first exposure, the second light-shielding sub-strip 1312' and the third light-shielding sub-strip 1313' of the second light-shielding strip 131' in the second mask splicing exposure region 130'-R-1 of the mask 13-1 respectively form the second sub-pattern and the third sub-pattern on the substrate, the second sub-pattern and the third sub-pattern overlap the eleventh sub-pattern and the twelfth sub-pattern at an overlapping region, and a pattern corresponding to the overlapping region is a second pattern 240. The second pattern 240 has a hexagonal shape. An area of the second pattern 240 is smaller than the preset threshold.

As shown in FIG. 22, the first pattern 240 is formed by a part of an edge 2405 of the eleventh sub-pattern, a fifteenth edge 2402 and a sixteenth edge 2401 of the twelfth sub-pattern formed on the substrate by the second light-shielding sub-strip 1312' and the third light-shielding sub-strip 1313' of the mask 13-2 during the second exposure and a part of an edge 2306 of the second sub-pattern, a fifth edge 2304 and a sixth edge 2303 of the third sub-pattern formed on the display substrate by the second light-shielding sub-strip of the mask 13-1 during the first exposure. The extension line of the fifteenth edge 2402 intersects the extension line of the sixteenth edge 2401 at a pattern (i.e., the fourth pattern below formed in the fourth region by using the third light-shielding sub-strip) corresponding to the third light-shielding strip of the mask 13-2 during the second exposure, so as to form one angle of the second pattern 240. Similarly, an extension line of the fifth edge 2304 intersects an extension line of the sixth edge 2303 at a pattern corresponding to the third light-shielding strip of the mask 13-1 during the first exposure, so as to form another angle of the second pattern 240.

Specifically, the second pre-pattern formed after the second exposure in FIG. 23 is shifted to the left by the maximum position deviation D relative to the second pre-pattern in FIG. 21, and then is shifted downwards by the maximum position deviation D.

A part of the projection of the second light-shielding strip 131' in the first mask exposure region 130'-L-2 of the mask 13-2 onto the substrate during the second exposure overlap a part of the projection of the second light-shielding strip 131' in the second mask splicing exposure region 130'-R-1 of the mask 13-1 onto the substrate during the first exposure. As shown in FIG. 23, during the second exposure, the second light-shielding sub-strip 1312' and the third light-shielding sub-strip 1313' of the second light-shielding strip 131' in the first mask exposure region 130'-L-2 of the mask 13-2 respectively form the thirteenth sub-pattern and the fourteenth sub-pattern on the substrate. During the first exposure, the second light-shielding sub-strip 1312' and the third light-shielding sub-strip 1313' of the second light-shielding strip 131' in the second mask splicing exposure region 130'-R-1 of the mask 13-1 respectively form the second sub-pattern and the third sub-pattern on the substrate, the second sub-pattern and the third sub-pattern overlap the thirteenth sub-pattern and the fourteenth sub-pattern at an overlapping region, and a pattern corresponding to the overlapping region is a third pattern 250. The third pattern 250 has a shape similar to a hexagon. An area of the third pattern 250 is smaller than the preset threshold.

As shown in FIG. 23, the third pattern 250 is formed by a part of an edge 2505 of the thirteenth sub-pattern, a part of a seventeenth edge 2502 and an eighteenth edge 2501 of the fourteenth sub-pattern and a part of the edge 2306 of the second sub-pattern, a part of the fifth edge 2304 of the third sub-pattern and the sixth edge 2303 formed on the substrate by the second light-shielding sub-strip and the third light-shielding sub-strip of the mask 13-1 during the first exposure as well as a part of an edge 2307 of the fifteenth sub-pattern formed on the substrate by the first light-shielding sub-strip of the mask 13-1 during the first exposure. An extension line of the seventeenth edge 2502 intersects an extension line of the eighteenth edge 2501 at a pattern (i.e., the fourth pattern below formed in the fourth region by using the third light-shielding sub-strip) corresponding to the third light-shielding strip of the mask 13-2 during the second exposure, so as to form one angle of the third pattern 250. Similarly, the extension line of the fifth edge 2304 intersects the extension line of the sixth edge 2303 at a pattern corresponding to the third light-shielding strip of the mask 13-1 during the first exposure, so as to form another angle of the third pattern 250.

Specifically, the second pre-pattern formed after the second exposure in FIG. 24 is shifted to the right by the maximum position deviation D relative to the second pre-pattern in FIG. 21, and then is shifted upwards by the maximum position deviation D.

A part of the projection of the second light-shielding strip 131' in the first mask exposure region 130'-L-2 of the mask 13-2 onto the substrate during the second exposure overlap a part of the projection of the second light-shielding strip 131' in the second mask splicing exposure region 130'-R-1 of the mask 13-1 onto the substrate during the first exposure. As shown in FIG. 24, during the second exposure, the second light-shielding sub-strip 1312' and the third light-shielding sub-strip 1313' of the second light-shielding strip 131' in the first mask exposure region 130'-L-2 of the mask 13-2 respectively form the sixteenth sub-pattern and the seventeenth sub-pattern on the substrate. During the first exposure, the second light-shielding sub-strip 1312' and the third light-shielding sub-strip 1313' of the second light-shielding strip 131' in the second mask splicing exposure region 130'-R-1 of the mask 13-1 respectively form the second sub-pattern and the third sub-pattern on the substrate, the second sub-pattern and the third sub-pattern overlap the sixteenth sub-pattern and the seventeenth sub-pattern at an overlapping region, and a pattern corresponding to the overlapping region is a fourth pattern 260. The fourth pattern 260 has a hexagonal shape. And an area of the fourth pattern 260 is smaller than the preset threshold.

As shown in FIG. 24, the first pattern 260 is formed by a part of an edge 2605 of the sixteenth sub-pattern, a nineteenth edge 2602 and a part of a twentieth edge 2601 of the seventeenth sub-pattern and a part of the edge 2306 of the second sub-pattern, the fifth edge 2304 and a part of the sixth edge 2303 of the third sub-pattern formed on the substrate by the second light-shielding sub-strip of the mask 13-1 during the first exposure. An extension line of the nineteenth edge 2602 intersects an extension line of the twentieth edge 2601 at a pattern (i.e., the fourth pattern below formed in the fourth region by using the third light-shielding sub-strip) corresponding to the third light-shielding strip of the mask 13-2 during the second exposure, so as to form one angle of the fourth pattern 260. Similarly, the extension line of the fifth edge 2304 intersects the extension line of the sixth edge 2303 at a pattern corresponding to the third light-shielding strip of the mask 13-1 during the first exposure, so as to form another angle of the fourth pattern 260.

Specifically, the second pre-pattern formed after the second exposure in FIG. 25 is shifted to the right by the maximum position deviation D relative to the second pre-pattern in FIG. 21, and then is shifted downwards by the maximum position deviation D.

The aligning the mask with the fourth region of the substrate to perform the second exposure, includes: forming a tenth sub-pattern in the fourth region by using the third light-shielding sub-strip, where the tenth sub-pattern includes an eleventh edge and a twelfth edge corresponding to the third edge and the fourth edge respectively, the eleventh edge is parallel to the boundary line, and a distance between the eleventh edge and the boundary line is zero; and forming a fourth pattern in the fourth region by using the third light-shielding sub-strip. Center lines of the third sub-pattern, the tenth sub-pattern and the fourth pattern coincide with each other, and the third sub-pattern overlaps the tenth sub-pattern and the fourth pattern at an overlapping region.

A part of the projection of the second light-shielding strip 131' in the first mask exposure region 130'-L-2 of the mask 13-2 onto the substrate during the second exposure overlap a part of the projection of the second light-shielding strip 131' in the second mask splicing exposure region 130'-R-1 of the mask 13-1 onto the substrate during the first exposure. As shown in FIG. 25, the third light-shielding sub-strip 1313' of the second light-shielding strip 131' in the first mask splicing exposure region 130'-L-2 of the mask 13-2 forms the tenth sub-pattern on the substrate during the second exposure, the third light-shielding strip 131 in the first mask splicing exposure region 130'-L-2 of the mask 13-2 forms the fourth pattern on the substrate during the second exposure, the third light-shielding sub-strip 1313' of the second light-shielding strip 131' in the second mask splicing exposure region 130'-R-1 of the mask 13-1 forms the third sub-pattern on the substrate during the first exposure, The center lines of the third sub-pattern, the tenth sub-pattern and the fourth pattern coincide with each other, and the third sub-pattern overlap the tenth sub-pattern and the fourth pattern at an overlapping region, and a pattern corresponding to the overlapping region is a fifth pattern 270. The fifth pattern 270 has a hexagonal shape. And an area of the fifth pattern 270 is smaller than the preset threshold.

As shown in FIG. 25, the fifth pattern 270 is formed by a part of a twenty-first edge 2702 and a part of a twenty-second edge 2703 of the tenth sub-pattern, a part of an edge 2701 of the fourth pattern and a part of the fifth edge 2304 and a part of the sixth edge 2303 of the third pattern. An extension line of the fifth edge 2304 intersects an extension line of the sixth edge 2303 at the pattern corresponding to the third light-shielding strip of the mask 13-1 during the first exposure, so as to form one angle of the fifth pattern 270.

A touch panel is further provided, including: a substrate; a touch driving electrode disposed on the substrate; and a touch sensing electrode disposed on the substrate. At least one of the touch driving electrode and the touch sensing electrode has a metal mesh-like structure including nodes, each node includes a first protruding structure and a second protruding structure distributed on both sides of a center line of a mesh bar, and the first protruding structure and the second protruding structure are arranged in a staggered manner along a direction of the center line.

In some embodiments, the mesh-like structure maybe formed by using the exposure method according to any one of the above embodiments.

In some embodiments, the mesh-like structure includes a metal mesh-like structure.

In some embodiments, the touch panel may be a One Glass Solution (OGS) touch panel or a Glass-Glass (GG) touch panel.

In some embodiments, the OGS touch panel may be as shown in FIG. 2, and at least one of the touch sensing electrode 24 and the touch driving electrode 26 may include the metal mesh-like structure.

Figure 26:
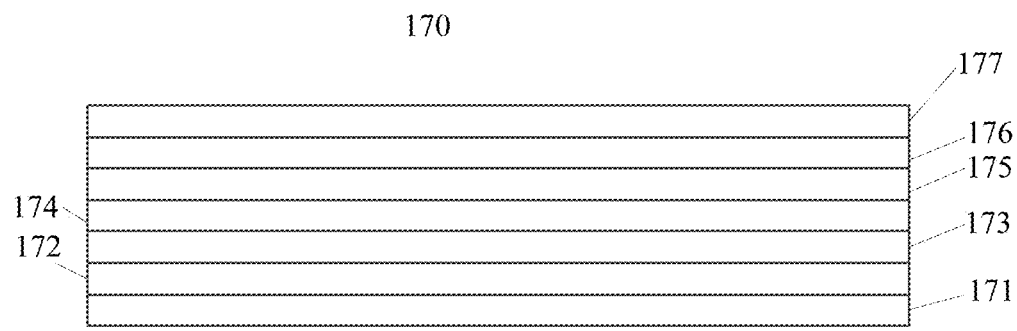
FIG. 26 is another schematic view of a structure of the touch panel according to an embodiment of the present disclosure.

In some embodiments, as shown in FIG. 26, the CG touch panel 170 may include: a first substrate 171, a touch driving electrode 172 provided on the first substrate 171, a first covering layer (overcoat (OC)) 173 provided on the touch driving electrode 172, a touch sensing electrode 174 provided on the first covering layer 173, a second covering layer 175 provided on the touch sensing electrode 174, an adhesive material layer 176 provided on the second covering layer 175 and a second substrate 177 provided on the adhesive material layer 176. At least one of the touch sensing electrode 174 and the touch driving electrode 172 may include the metal mesh-like structure. The first substrate 171 and the second substrate 177 may each be a glass substrate.

It should be appreciated that the node herein may be a structure formed during one exposure and patterning process by using the mask, or a structure formed in multiple exposure and patterning processes by using the mask. In the present disclosure, it mainly takes a splicing node formed by multiple exposure patterning processes by using the mask as an example.

Figure 27:
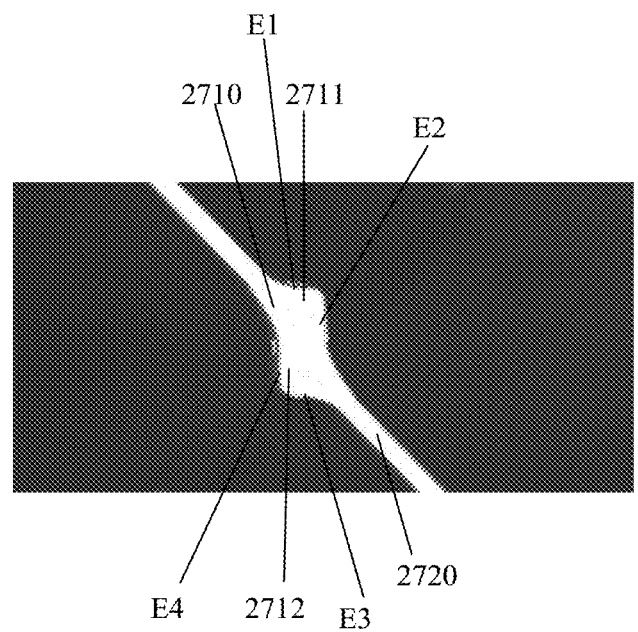
FIG. 27 is another schematic view of the splicing pattern according to an embodiment of the present disclosure.

In some embodiments, the mesh-like structure includes the splicing node 2710, as shown in FIG. 27, the splicing node includes a first protruding structure 2711 and a second protruding structure 2712 distributed on both sides of a center line of a mesh bar, and the first protruding structures 2711 and the second protruding structures 2712 are arranged in a staggered manner along a direction of the center line.

As shown in FIG. 27, the first protruding structure 2711 and the second protruding structure 2712 each includes an arc-shaped edge.

In some embodiments, the substrate includes a third region, a fourth region and a boundary line between the third region and the fourth region, and the splicing nodes are sequentially arranged along the boundary line. In some embodiments, as shown in FIG. 10, the mask 13 is provided with the first region 130' on only one side. When the mask 13 as shown in FIG. 10 is used to perform one splicing exposure process, the formed mesh-like structure includes a sixth region and a seventh region, the sixth region is a strip-shaped region located at the boundary line and extending along the boundary line, and the seventh region is an region other than the sixth region in the mesh-like structure. The sixth region includes the splicing nodes, and the splicing nodes are sequentially arranged along the boundary line. In some embodiments, a center line of the sixth region along the direction of the boundary line coincides with the boundary line. For example, sixth and seventh regions are denoted as 29C and 2901 of FIG. 29, respectively.

In some embodiments, when the mask 13 shown in FIG. 10 is used to perform the splicing exposure process, the mask needs to be rotated during the second exposure in such a manner that an orthographic projection of the first region of the mask onto the substrate during the second exposure coincides with an orthographic projection of the first region of the mask onto the substrate during the first exposure.

The sixth region includes the splicing node denoted by 2710 in FIG. 27. In some embodiments, the splicing node may correspond to any one of the first pattern 230, the second pattern 240, the third pattern 250, the fourth pattern 260 and the fifth pattern 270. The mesh bar in the seventh area corresponds to the third light-shielding bar 131.

In some embodiments, when the center line of the sixth region along the direction of the boundary line coincides with the boundary line, the splicing nodes are sequentially arranged along the center line of the sixth region along the direction of the boundary line.

Figure 15:
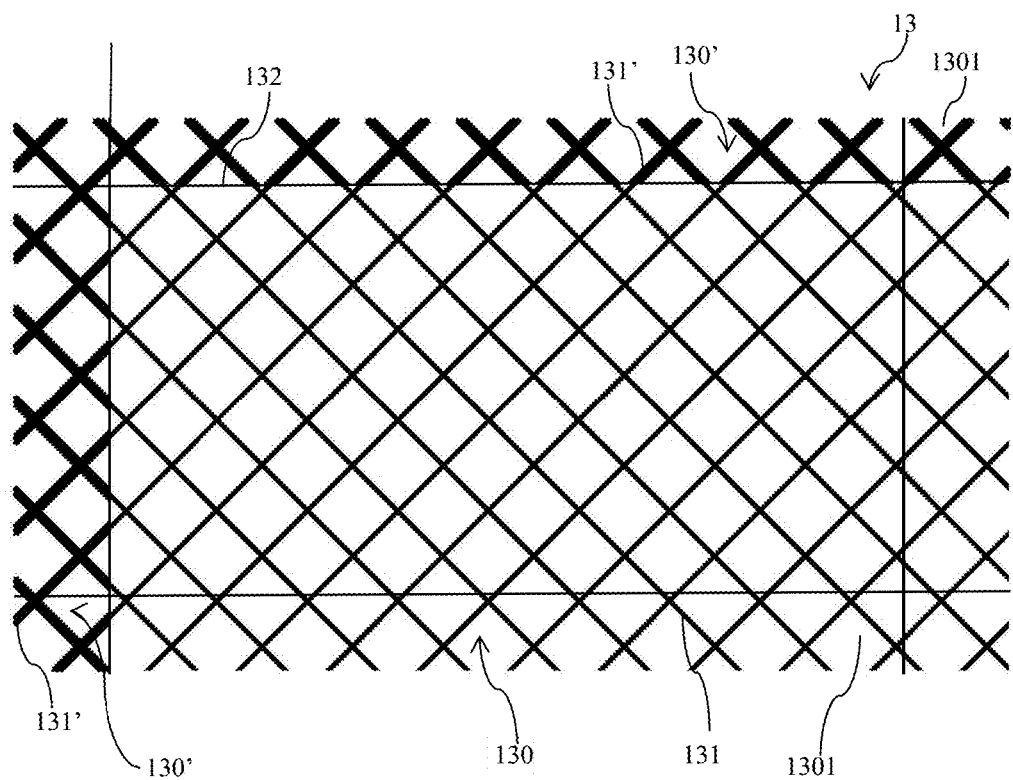
FIG. 15 is still yet another schematic view showing a structure of the mask according to an embodiment of the present disclosure.
Figure 16:
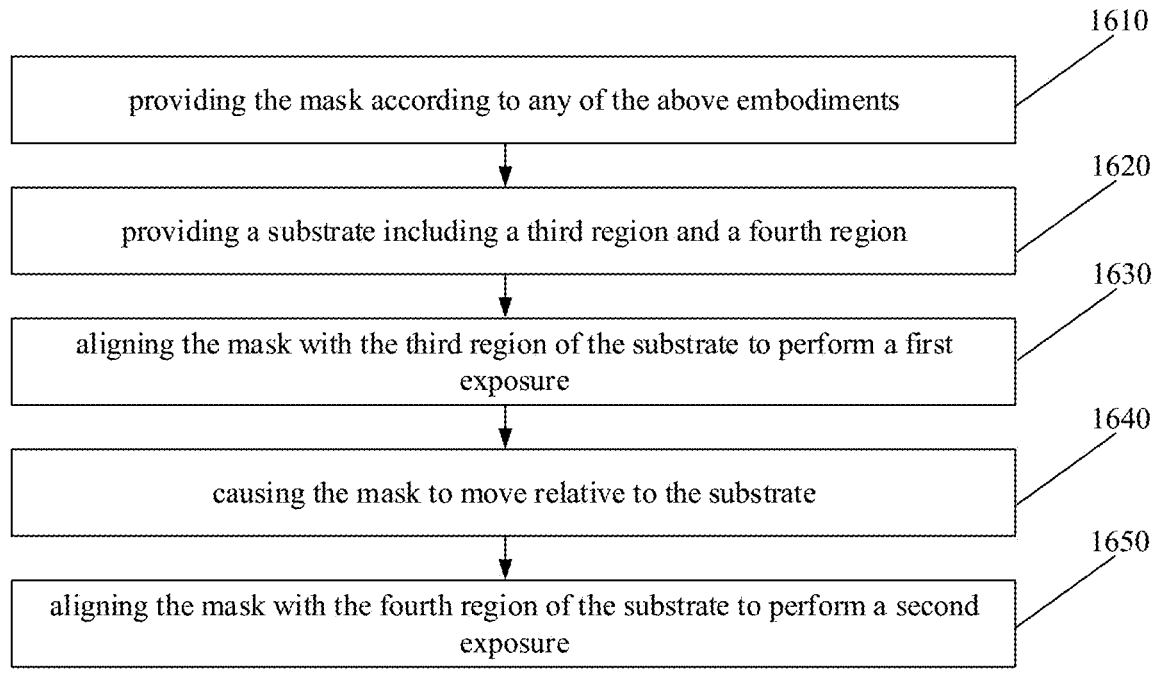
FIG. 16 is a flowchart of an exposure method according to an embodiment of the present disclosure.

In some embodiments, when the mask is of a rectangular shape, the first region may also be provided on two adjacent sides of the mask, as shown in FIG. 15. The mask may be used in two splicing exposures, and there are two splicing exposure regions. At this time, the substrate may further include a second boundary line between the fourth region and a eighth region, the second boundary line intersects the boundary line between the third region and the fourth region, and the mesh-like structure further includes the sixth region located at the second boundary line, that is, the mesh-like structure includes two sixth regions.

In some embodiments, the mask as shown in FIG. 15 may also be used for one splicing exposure, and the formed mesh-like structure further include a fifth region, which corresponds to the first region of the mask. For example, the fifth region is denoted as 2902 in FIG. 29.

In some embodiments, the mesh-like structure includes a fifth region located on at least one side of the third region and the fourth region away from the boundary line, the third region includes a first mesh bar, the fourth region includes a second mesh bar, the fifth region includes a third mesh bar, a width of the third mesh bar in a direction perpendicular to an extending direction of the third mesh bar is larger than a width of the first mesh bar in a direction perpendicular to an extending direction of the first mesh bar, and/or, the width of the third mesh bar in the direction perpendicular to the extending direction of the third mesh bar is larger than a width of the second mesh bar in a direction perpendicular to an extending direction of the second mesh bar.

In some embodiments, the first regions may also be provided on two opposite sides of the mask, as shown in FIG. 13. After the mask has been used in a first splicing exposure, there is no need to rotate the mask in the second exposure. The mesh-like structure formed in one splicing exposure by using the mask further includes the fifth region in addition to the sixth region and the seventh region. When the mask is of the rectangular shape, the fifth region is located on two opposite sides of the mesh-like structure.

Figure 14:
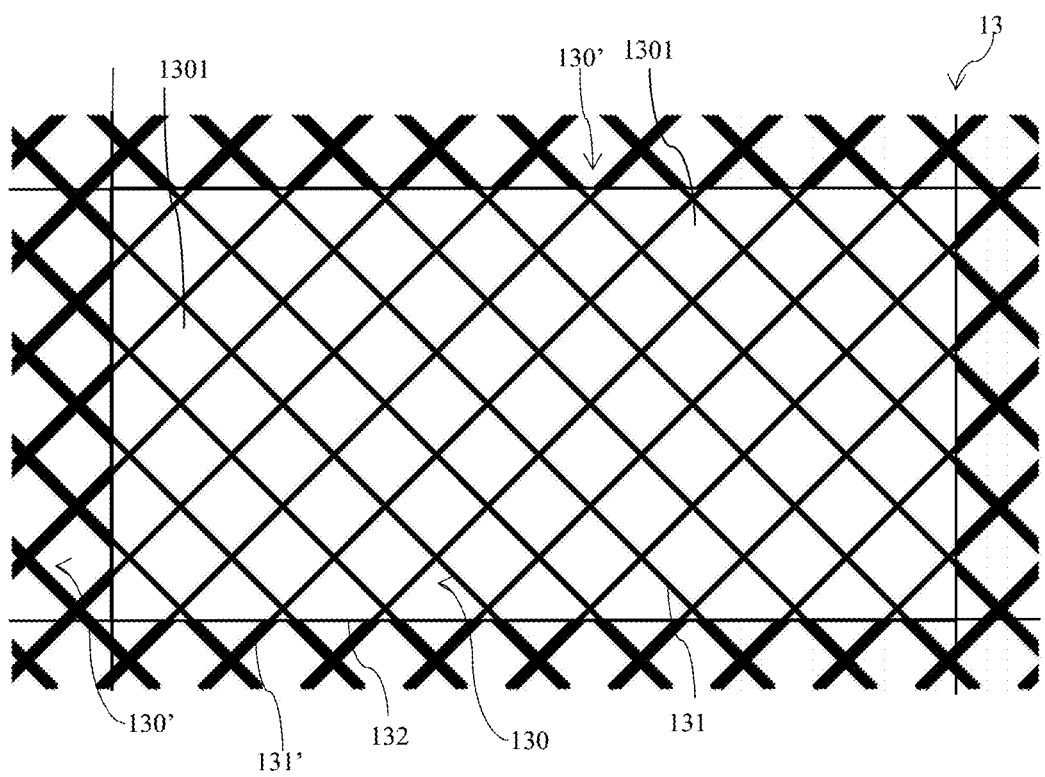
FIG. 14 is still yet another schematic view showing a structure of the mask according to an embodiment of the present disclosure.

In some embodiments, when the mask is of the rectangular shape, the first region may also be provided on four sides of the mask, as shown in FIG. 14. The mask shown in FIG. 14 may be used in four splicing exposures, and the formed mesh-like structure has the fifth region formed on its four sides.

In some embodiments, the mesh-like structure includes a fourth mesh bar connected to at least one end of the splicing node, a distance between a vertex of the splicing node and a center line of the fourth mesh bar is d3, a width of the fourth mesh bar is d4, a ratio of d3 to d4 is n=d3/d4, and n is larger than or equal to 1 and smaller than or equal to 2.3.

As shown in FIG. 27, the mesh-like structure includes a fourth mesh bar 2720 connected to at least one end of the splicing node 2710, a distance between a vertex of the splicing node 2710 and a center line of the fourth mesh bar is d3, a width of the fourth mesh bar is d4, a ratio of d3 to d4 is n=d3/d4, and n is larger than or equal to 1 and smaller than or equal to 2.3. In some embodiments, n may be 1, 5/3, or 6/3.

In some embodiments, lengths of two side edges of the first protruding structure intersecting the center line of the mesh bar are not equal to each other, and/or lengths of two side edges of the second protruding structure intersecting the center line of the mesh bar are not equal to each other.

As shown in FIG. 27, the first protruding structure 2711 has a first side edge E1 and a second side edge E2 that intersect the center line of the fourth mesh bar, and lengths of the first side edge E1 and the second side edge E2 are not equal to each other. The second protruding structure 2712 has a third side edge E3 and a fourth side edge E4 that intersect the center line of the fourth mesh bar, and lengths of the third side edge E3 and the fourth side edge E4 are not equal to each other.

In some embodiments, as shown in FIG. 27, a length of the first side edge E1 of the two side edges of the first protruding structure 2711 away from the second protruding structure 2712 is smaller than a length of the second side edge E2 close to the second protruding structure 2712, and/or a length of the third side edge E3 of the two side edges of the second protruding structure 2712 away from the first protruding structure 2711 is smaller than a length of a fourth side edge E4 close to the first protruding structure 2711.

In some embodiments, the first protruding structure and the second protruding structure in at least one of the splicing nodes are arranged in a central symmetry manner.

In some embodiments, as shown in FIG. 27, the two side edges of the first protruding structure 2711 include the first side edge E1 away from the second protruding structure 2712 and the second side edge E2 close to the second protruding structure 2712, the two side edges of the second protruding structure 2712 include the third side edge E3 away from the first protruding structure 2711 and the fourth side edge E4 close to the first protruding structure 2711, the first side edge is angled at a first included angle β1 relative to the center line of the mesh bar, the second side edge is angled at a second included angle β2 relative to the center line of the mesh bar, the third side edge is angled at a third included angle β3 relative to the center line of the mesh bar, the fourth side edge is angled at a fourth included angle β4 relative to the center line of the mesh bar, the first side edge is angled at a fifth included angle β5 relative to the second side edge, and the third side edge is angled at a sixth included angle β6 relative to the fourth side edge, where β1 is larger than or equal to 110° and smaller than or equal to 150°, β2 is larger than or equal to 125° and smaller than or equal to 165°, β3 is larger than or equal to 110° and smaller than or equal to 150°, β4 is larger than or equal to 125° and smaller than or equal to 165°, and β5 is larger than or equal to 80° and smaller than or equal to 100°, β6 is larger than or equal to 80° and smaller than or equal to 100°.

By providing the above splicing node, it is able to prevent the occurrence of an open circuit due to a too small width of the conductive line at the splicing position, and prevent the occurrence of a ghost image due to a too large width of the conductive line at the splicing position.

In some embodiments, the mesh-like structure includes a fifth mesh bar and a sixth mesh bar connected to both ends of the splicing node respectively, a distance between a center line of the fifth mesh bar and a center line of the sixth mesh bar is d5, and d5 is larger than or equal to 0 and smaller than or equal to 6 μm.

Figure 28:
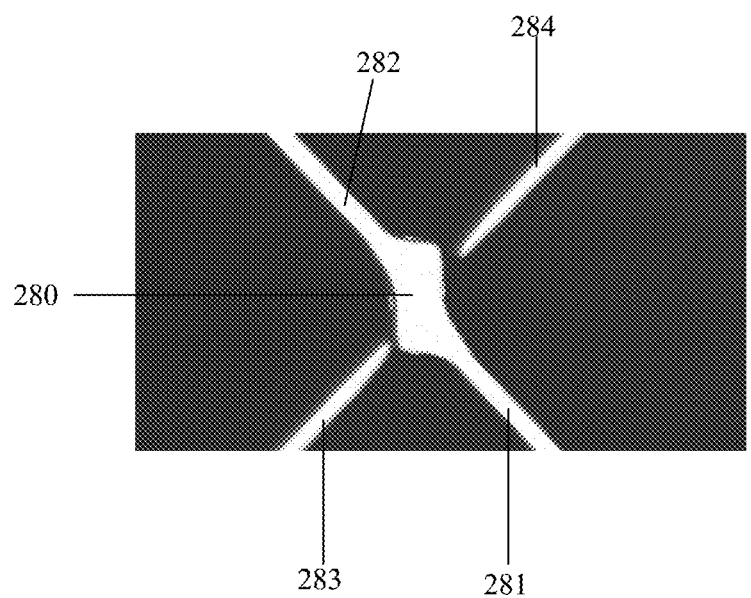
FIG. 28 is yet another schematic view of the splicing pattern according to an embodiment of the present disclosure.

As shown in FIG. 28, the mesh-like structure includes a fifth mesh bar 281 and a sixth mesh bar 282 connected to both ends of the splicing node 280 respectively, a distance between a center line of the fifth mesh bar and a center line of the sixth mesh bar is d5, and d5 is equal to 0.

In some embodiments, the distance d5 between the center line of the fifth mesh bar and the center line of the sixth mesh bar correspond to a component of the position deviation of the mask in two exposures in a direction parallel to the boundary line. For example, when the component of the position deviation of the mask in two adjacent exposures in the direction parallel to the boundary line between the third region and the fourth region is 6 μm, as shown in FIGS. 23 and 24, the distance d5 between the center line of the fifth mesh bar and the center line of the sixth mesh bar is also 6 μm.

In some embodiments, the touch driving electrode and the touch sensing electrode are laminated one on another in a direction perpendicular to the substrate, the touch driving electrode and the touch sensing electrode each has the mesh-like structure including splicing nodes, and the splicing nodes in different layers are arranged approximately along a same straight line or the splicing nodes in different layers are arranged approximately along two straight lines.

In some embodiments, the splicing nodes in the touch driving electrode and the touch sensing electrode in different layers are arranged along a same straight line or along two straight lines respectively.

In some embodiments, the touch driving electrode and the touch sensing electrode are laminated one on another in a direction perpendicular to the substrate, the touch driving electrode and the touch sensing electrode each has the mesh-like structure, the mesh-like structure includes splicing nodes, and orthographic projections of the splicing nodes in different layers onto the substrate at least partially overlap each other.

In some embodiments, as shown in FIG. 28, the orthographic projections of the splicing nodes in the touch driving electrode and the touch sensing electrode of different layers onto the substrate at least partially overlap each other, so as to avoid the adverse influence of splicing nodes on the uniformity of the mesh. A mesh bar 283 and a mesh bar 284 are in different layers from the fifth mesh bar 281, the sixth mesh bar 282 and the splicing node 280.

It should be appreciated that, the above embodiments have been described in a progressive manner, and the same or similar contents in the embodiments will not be repeated, i.e., each embodiment merely focuses on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above are merely specific embodiments of the present disclosure, but a protection scope of the present disclosure is not limited thereto. Any modifications or replacements that would easily occurred to a person skilled in the art, without departing from the technical scope disclosed in the disclosure, should be encompassed in the protection scope of the present disclosure. Therefore, the protection scope of the present disclosure shall be subject to the protection scope of the claims.

The invention claimed is:

1. A touch panel, comprising:
a substrate;
a touch driving electrode disposed on the substrate; and
a touch sensing electrode disposed on the substrate,
wherein at least one of the touch driving electrode and the touch sensing electrode has a metal mesh-like structure comprising nodes, each node comprises a first protruding structure and a second protruding structure distributed on both sides of a center line of a mesh bar, and the first protruding structure and the second protruding structure are arranged in a staggered manner along a direction of the center line;
wherein two side edges of the first protruding structure comprise a first side edge away from the second protruding structure and a second side edge close to the second protruding structure, two side edges of the second protruding structure comprise a third side edge away from the first protruding structure and a fourth side edge close to the first protruding structure, the first side edge is angled at a first included angle $\beta 1$ relative to the center line of the mesh bar, the second side edge is angled at a second included angle $\beta 2$ relative to the center line of the mesh bar, the third side edge is angled at a third included angle $\beta 3$ relative to the center line of the mesh bar, the fourth side edge is angled at a fourth included angle $\beta 4$ relative to the center line of the mesh bar, the first side edge is angled at a fifth included angle $\beta 5$ relative to the second side edge, and the third side edge is angled at a sixth included angle $\beta 6$ relative to the fourth side edge,
wherein $\beta 1$ is larger than or equal to 110° and smaller than or equal to 150°, $\beta 2$ is larger than or equal to 125° and smaller than or equal to 165°, $\beta 3$ is larger than or equal to 110° and smaller than or equal to 150°, $\beta 4$ is larger than or equal to 125° and smaller than or equal to 165°, $\beta 5$ is larger than or equal to 80° and smaller than equal to 100°, and $\beta 6$ is larger than or equal to 80° and smaller than or equal to 100°.

2. The touch panel according to claim 1, wherein the first protruding structure and the second protruding structure each comprises an arc-shaped edge; and/or the substrate comprises a third region, a fourth region and a boundary line between the third region and the fourth region, and the nodes are sequentially arranged along the boundary line; and/or
the first protruding structure and the second protruding structure in at least one of the nodes are arranged in a central symmetry manner; and/or
the mesh-like structure comprises a fourth mesh bar connected to at least one end of the node, a distance between a vertex of the node and a center line of the fourth mesh bar is d3, a width of the fourth mesh bar is d4, a ratio of d3 to d4 is n=d3/d4, and n is larger than or equal to 1 and smaller than or equal to 2.3; and/or
the mesh-like structure comprises a fifth mesh bar and a sixth mesh bar connected to both ends of the node respectively, a distance between a center line of the fifth mesh bar and a center line of the sixth mesh bar is d5, and d5 is larger than or equal to 0 and smaller than or equal to 6 μm.

3. The touch panel according to claim 1, wherein the mesh-like structure comprises a fifth region located on at least one side of the third region or the fourth region away from the boundary line,
the third region comprises a first mesh bar, the fourth region comprises a second mesh bar, the fifth region comprises a third mesh bar, a width of the third mesh bar in a direction perpendicular to an extending direction of the third mesh bar is larger than a width of the first mesh bar in a direction perpendicular to an extending direction of the first mesh bar, and/or, the width of the third mesh bar in the direction perpendicular to the extending direction of the third mesh bar is larger than a width of the second mesh bar in a direction perpendicular to an extending direction of the second mesh bar.

4. The touch panel according to claim 1, wherein lengths of two side edges of the first protruding structure intersecting the center line of the mesh bar are not equal to each other, and/or lengths of two side edges of the second protruding structure intersecting the center line of the mesh bar are not equal to each other; and/or
wherein a length of a first side edge of the two side edges of the first protruding structure away from the second protruding structure is smaller than a length of a second side edge close to the second protruding structure, and/or a length of a third side edge of the two side edges of the second protruding structure away from the first protruding structure is smaller than a length of a fourth side edge close to the first protruding structure.

5. The touch panel according to claim 1, wherein the touch driving electrode and the touch sensing electrode are laminated one on another in a direction perpendicular to the substrate, the touch driving electrode and the touch sensing electrode each has the mesh-like structure comprising the nodes, and the nodes in different layers are arranged approximately along a same straight line or the nodes in different layers are arranged approximately along two straight lines; and/or wherein the touch driving electrode and the touch sensing electrode are laminated one on another in a direction perpendicular to the substrate, the touch driving electrode and the touch sensing electrode each has the mesh-like structure comprising the nodes, and orthographic projections of the nodes in different layers onto the substrate at least partially overlap each other.

* * * * *